US008446152B2

(12) United States Patent
Tsubamoto

(10) Patent No.: US 8,446,152 B2
(45) Date of Patent: *May 21, 2013

(54) PRINTED CIRCUIT BOARD TEST ASSISTING APPARATUS, PRINTED CIRCUIT BOARD TEST ASSISTING METHOD, AND COMPUTER-READABLE INFORMATION RECORDING MEDIUM

(75) Inventor: Daita Tsubamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 398 days.

This patent is subject to a terminal disclaimer.

(21) Appl. No.: 12/823,217

(22) Filed: Jun. 25, 2010

(65) Prior Publication Data

US 2011/0018548 A1 Jan. 27, 2011

(30) Foreign Application Priority Data

Jul. 22, 2009 (JP) ................................. 2009-171565

(51) Int. Cl.
*G01R 31/02* (2006.01)

(52) U.S. Cl.
USPC ......................................................... 324/537

(58) Field of Classification Search
USPC .. 702/17; 703/13, 14; 716/110–139; 324/537
See application file for complete search history.

(56) References Cited

U.S. PATENT DOCUMENTS

| 6,184,478 B1 | 2/2001 | Imano et al. |
| 6,426,469 B2 | 7/2002 | Koga et al. |
| 6,763,503 B1 * | 7/2004 | Yang et al. .................... 716/115 |
| 6,771,807 B2 | 8/2004 | Coulombe et al. |
| 6,845,492 B1 * | 1/2005 | Frank et al. .................... 716/112 |
| 6,859,915 B1 * | 2/2005 | Frank et al. .................... 716/112 |
| 2009/0007035 A1 * | 1/2009 | Su et al. ............................ 716/5 |

FOREIGN PATENT DOCUMENTS

| CN | 1401107 A | 3/2003 |
| JP | 2000-114722 | 4/2000 |
| JP | 2001-217508 | 8/2001 |
| JP | 2001-331539 | 11/2001 |

OTHER PUBLICATIONS

O'Sullivan et al., Ground Starvation Effects on Multi-layer PCBs, IEEE International Symposium on Electromagnetic Compatibility, 2000, vol. 1, No., pp. 113-116 vol. 1, 2000.*
Chinese First Office Action dated Nov. 1, 2012 corresponding to Chinese Patent Application No. 201010235597.X and English translation thereof.

* cited by examiner

*Primary Examiner* — Melissa Koval
*Assistant Examiner* — Daniel Miller
(74) *Attorney, Agent, or Firm* — Squire Sanders (US) LLP

(57) ABSTRACT

A printed circuit board test assisting apparatus includes an input part that has the attribute information of the wiring pattern input thereto; a degradation degree process part that obtains a degradation degree in signal characteristics in a wiring pattern corresponding to attribute information that is input to the input part, based on position information of the wiring pattern corresponding to the attribute information input to the input part, the position information and the size information of the pattern removed area, and the degradation degree information; and an extracting process part that extracts for an actual measurement test a wiring pattern that has a degradation degree equal to or more than a predetermined degree, from wiring patterns for which degradation degrees have been obtained by the degradation degree process part.

13 Claims, 25 Drawing Sheets

FIG.3A
FIG.3B
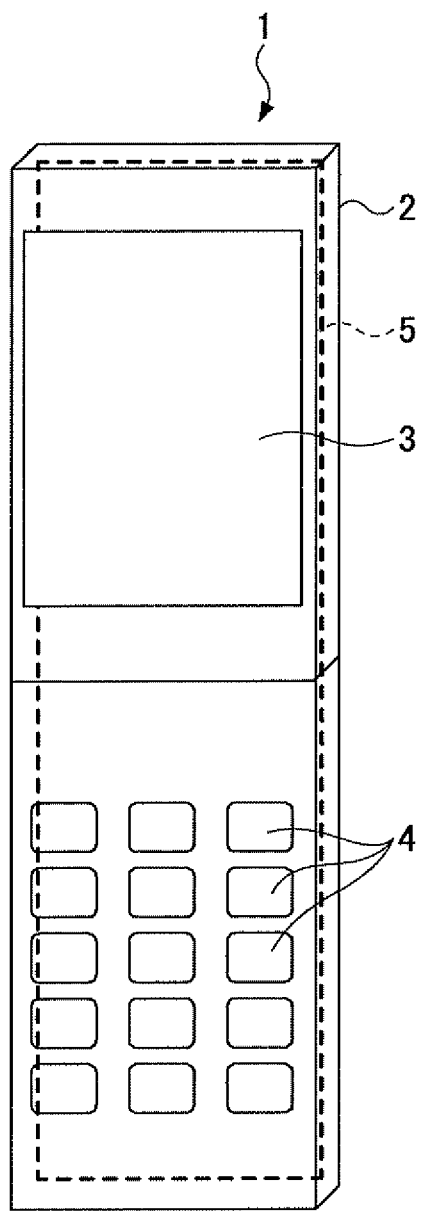
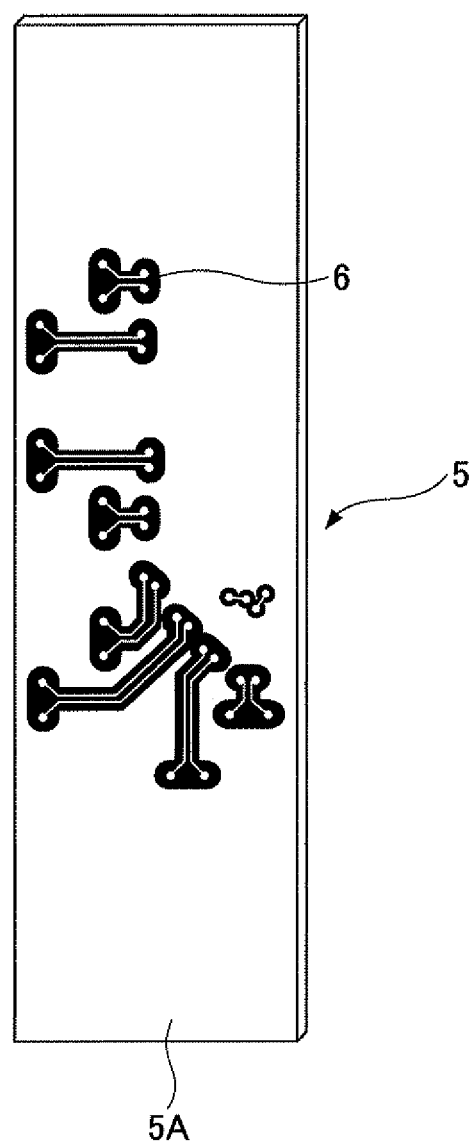

FIG.5A

| No. | LAYER | SIGNAL NAME | DATA RATE | ELECTRIC CONDUC-TIVITY (S/m) | DIELEC-TRIC CONSTANT | WIRING WIDTH (mm) | WIRING THICKNESS (mm) | INTERLAYER DISTANCE (mm) | WIRING HEIGHT (mm) | START-POINT COORDINATE (mm) | | END-POINT COORDINATE (mm) | |
|---|---|---|---|---|---|---|---|---|---|---|---|---|---|
| | | | | | | | | | | X | Y | X | Y |
| 1 | 3 | data001 | 1e** | 5×10³ | 3.8 | 0.1 | 0.035 | 0.255 | 0.1 | 10 | 20 | 50 | 20 |
| 2 | 3 | data001 | 1e** | 5×10³ | 3.8 | 0.1 | 0.035 | 0.255 | 0.1 | 50 | 20 | 50 | 40 |
| 3 | 3 | data001 | 1e** | 5×10³ | 3.8 | 0.1 | 0.035 | 0.255 | 0.1 | 50 | 40 | 80 | 40 |
| .. | .. | .. | .. | .. | .. | .. | .. | .. | .. | .. | .. | .. | .. |
| n | 5 | data*** | 1e** | 5×10³ | 3.8 | — | 0.035 | 0.255 | 0.1 | — | — | — | — |

FIG.5B

| No. | LAYER | DIAMETER (mm) | CENTER COORDINATE (mm) | |
|---|---|---|---|---|
| | | | X | Y |
| 1 | 4 | 3.0 | 30 | 22.5 |
| 2 | 4 | 3.0 | 70 | 37.5 |
| ⋮ | ⋮ | ⋮ | ⋮ | ⋮ |
| n | — | 3.0 | — | — |

FIG.5C

| No. | LAYER | CONNECTION DESTINATION | DIAMETER (mm) | CENTER COORDINATE (mm) | |
|---|---|---|---|---|---|
| | | | | X | Y |
| 1 | 1-3 | data001 | 0.8 | 80 | 40 |
| 2 | 1-5 | GND | 0.8 | 80 | 20 |
| ⋮ | ⋮ | ⋮ | ⋮ | ⋮ | ⋮ |
| n | 1-5 | data001 | 0.8 | XX | XX |

FIG.7

| No. | LAYER | BOTH SIDES | ONE SIDE | IMMEDIATELY ABOVE/ IMMEDIATELY BELOW | SAME LAYER/ IMMEDIATELY ABOVE/ IMMEDIATELY BELOW | DETERMINATION |
|---|---|---|---|---|---|---|
| - | - | 1 | 0 | 0 | 1 | SOLID PATTERN REMOVED AREA EXISTS ON ONE SIDE |
| - | - | 1 | 0 | 0 | 0 | NO SOLID PATTERN REMOVED AREA EXISTS |
| - | - | 0 | 0 | 1 | 1 | SOLID PATTERN REMOVED AREA EXISTS IMMEDIATELY ABOVE/IMMEDIATELY BELOW |
| - | - | 1 | 0 | 0 | 1 | SOLID PATTERN REMOVED AREA EXISTS ON ONE SIDE |
| - | - | 1 | 0 | 0 | 0 | NO SOLID PATTERN REMOVED AREA EXISTS |
| - | - | 0 | 1 | 0 | 1 | SOLID PATTERN REMOVED AREAS EXIST ON BOTH SIDES |
| - | - | 0 | 0 | 1 | 1 | SOLID PATTERN REMOVED AREA EXISTS IMMEDIATELY ABOVE/IMMEDIATELY BELOW |

(IN CASE WHERE DIVIDING UNIT IS 0.5mm)

FIG.11

| X COORDINATE (mm) | Y COORDINATE (mm) | WHETHER SOLID PATTERN REMOVED AREA EXISTS |
|---|---|---|
| 28.5 | 20.5 | 0 |
| 28.5 | 21.0 | 1 |
| 28.5 | 21.5 | 1 |
| 29.0 | 20.5 | 0 |
| 29.0 | 21.0 | 1 |
| 29.0 | 21.5 | 1 |
| 29.5 | 20.5 | 0 |
| 29.5 | 21.0 | 1 |
| 29.5 | 21.5 | 1 |
| 30.0 | 20.5 | 0 |
| 30.0 | 21.0 | 1 |
| 30.0 | 21.5 | 1 |
| 30.5 | 20.5 | 0 |
| 30.5 | 21.0 | 1 |
| 30.5 | 21.5 | 1 |
| 31.0 | 20.5 | 0 |
| 31.0 | 21.0 | 0 |
| 31.0 | 21.5 | 1 |

START POINT

FIG.21

| DIELECTRIC CONSTANT | DISTANCE BETWEEN WIRING PATTERNS IN THICKNESS DIRECTION (mm) | NOISE PER UNIT AREA (mV) |
|---|---|---|
| 3.5 | 0.5 | 20 |
| | 1.0 | 15 |
| | 1.5 | 10 |
| 4.0 | 0.5 | 25 |
| | 1.0 | 20 |
| | 1.5 | 15 |
| 4.5 | 0.5 | 30 |
| | 1.0 | 25 |
| | 1.5 | 20 |

FIG.22

| DISTANCE BETWEEN WIRING PATTERNS (mm) | SOLID OFFSET (mm) | CORRECTION COEFFICIENT |
|---|---|---|
| 0 | 0 | 1 |
| 0 | 0.1 | 0.9 |
| 0 | 0.2 | 0.8 |
| 0.1 | 0 | 0.9 |
| 0.1 | 0.1 | 0.8 |
| 0.1 | 0.2 | 0.7 |
| 0.2 | 0 | 0.8 |
| 0.2 | 0.1 | 0.7 |
| 0.2 | 0.2 | 0.6 |

FIG.24

| X COORDINATE (mm) | Y COORDINATE (mm) | WHETHER SOLID PATTERN REMOVED AREA EXISTS | DISTANCE BETWEEN WIRING PATTERNS (mm) |
|---|---|---|---|
| 28.5 | 20.5 | 0 | — |
| 28.5 | 21.0 | 0 | — |
| 28.5 | 21.5 | 0 | — |
| 29.0 | 20.5 | 0 | — |
| 29.0 | 21.0 | 1 | 1.0 |
| 29.0 | 21.5 | 0 | — |
| 29.5 | 20.5 | 0 | — |
| 29.5 | 21.0 | 1 | 1.0 |
| 29.5 | 21.5 | 0 | — |
| 30.0 | 20.5 | 0 | — |
| 30.0 | 21.0 | 1 | 1.0 |
| 30.0 | 21.5 | 0 | — |
| 30.5 | 20.5 | 0 | — |
| 30.5 | 21.0 | 1 | 1.0 |
| 30.5 | 21.5 | 0 | — |
| 31.0 | 20.5 | 0 | — |
| 31.0 | 21.0 | 0 | — |
| 31.0 | 21.5 | 0 | — |

FIG.25A

| GRADE | No. | AREA OF SOLID PATTERN REMOVED AREA (mm²) | X COORDINATE OF SIGNAL VIA (mm) | Y COORDINATE OF SIGNAL VIA (mm) |
|---|---|---|---|---|
| 1 | 10 | 3.0 | 70 | 70 |
| 2 | 15 | 2.8 | 50 | 50 |
| 3 | 25 | 2.6 | 80 | 40 |
| 4 | 64 | 2.2 | 60 | 10 |
| 5 | 52 | 1.8 | 60 | 60 |

DETERMINATION CRITERION 2.5mm²

FIG.25B

| X COORDINATE OF GND VIA (mm) | Y COORDINATE OF GND VIA (mm) |
|---|---|
| 80 | 30 |

PRINTED CIRCUIT BOARD TEST ASSISTING APPARATUS, PRINTED CIRCUIT BOARD TEST ASSISTING METHOD, AND COMPUTER-READABLE INFORMATION RECORDING MEDIUM

CROSS-REFERENCE TO RELATED APPLICATIONS

This application is based upon and claims the benefit of priority of the prior Japanese Patent Application No. 2009-171565, filed on Jul. 22, 2009, the entire contents of which are incorporated herein by reference.

FIELD

The embodiments discussed herein are directed to a printed circuit board test assisting apparatus, a printed circuit board test assisting method and a computer-readable information recording medium.

BACKGROUND

For a printed circuit board for an electronic apparatus, high-density mounting has advanced in which the number of electronic devices to be mounted increases, a printed circuit board is miniaturized, and so forth.

As the high-density mounting has thus advanced, paths of electric currents have become complicated, and thus, issues of impedance mismatching or crosstalk in wiring, or such, become likely to occur. Therefore, more advanced circuit designing is required for such a high-density mounting printed circuit board.

For such a printed circuit board on which high-density mounting is carried out, work to confirm a wiring structure may be carried out. However, because of the great amount of work, various apparatuses that assist a designer have been proposed. For example, an apparatus that calculates a proper wiring structure, a printed circuit board that has a wiring pattern to be used for measurement, and so forth, have been proposed.

[Patent Document 1] Japanese Laid-Open Patent Application No. 2001-331539

[Patent Document 2] Japanese Laid-Open Patent Application No. 2001-217508

In the above-described high-density mounting, the amount of work for confirming a wiring structure on a printed circuit board or such becomes further greater, and the cost and time therefore become considerable. Therefore, it may be difficult to carry out, for all the wiring, a test for actually proving matching between a printed circuit board and design data, after manufacturing the printed circuit board.

However, an apparatus that efficiently assists in an actual measurement test to be carried out after manufacturing a high-density mounting printed circuit board has not been proposed.

SUMMARY

One embodiment of the present disclosure is a printed circuit board test assisting apparatus that assists in a test of wiring patterns that are formed in a printed circuit board. The printed circuit board test assisting apparatus includes a first database that stores attribute information and position information that indicate attributes and positions of the wiring patterns in a manner in which the attribute information and the position information are associated with the wiring patterns; a second database that stores position information and size information that indicate position and sizes of pattern removed areas that exist in solid patterns provided in the printed circuit board; a third database that stores degradation degree information that indicates degradation degrees in signal characteristics in the wiring patterns with respect to positional relationships between the wiring patterns and the pattern removed areas, and the sizes of the pattern removed areas; an input part that has attribute information of a wiring pattern input thereto; a degradation degree process part that obtains a degradation degree in signal characteristics in a wiring pattern corresponding to attribute information that is input to the input part, based on position information of the wiring pattern corresponding to the attribute information input to the input part, position information and size information of a pattern removed area, and the degradation degree information; and an extracting process part that extracts, for an actual measurement test, wiring patterns that have degradation degrees equal to or more than a predetermined degree, from wiring patterns for which degradation degrees have been obtained by the degradation degree process part.

The object and advantages of the disclosure will be realized and attained by means of the elements and combinations particularly pointed out in the claims.

It is to be understood that both the foregoing general description and the following detailed description are exemplary and explanatory and are not restrictive of the invention as claimed.

BRIEF DESCRIPTION OF DRAWINGS

FIGS. 3A and 3B depict an electronic apparatus for which calculation is carried out for assisting in a test of a printed circuit board by the printed circuit board test assisting apparatus in the embodiment 1, where FIG. 3A depicts a perspective see through view of the electronic apparatus and FIG. 3B depicts the printed circuit board included in the electronic apparatus;

FIGS. 5A through 5C depict one example of CAD data used by the printed circuit board test assisting apparatus in the embodiment 1;

FIG. 7 depicts one example of a result of classification of positional relationships between wiring patterns and solid pattern removed areas in the printed circuit board test assisting apparatus in the embodiment 1;

FIG. 11 depicts a determination result of FIG. 10 in the form of a table;

FIG. 21 depicts a table of noise per unit area for calculating intensity of crosstalk per unit area of a crosstalk area in the printed circuit board test assisting apparatus in the embodiment 2;

FIG. 22 depicts a table of a correction coefficient used in calculating intensity of crosstalk in the printed circuit board test assisting apparatus in the embodiment 2;

FIG. 24 depicts in the form of a table a determination result of FIG. 23 together with an extracting result of distances between wiring patterns; and FIGS. 25A and 25B depict a grading result and an extracting result in calculating intensity of crosstalk in a printed circuit board test assisting apparatus in an embodiment 3.

DESCRIPTION OF EMBODIMENTS

Below, embodiments applying a printed circuit board test assisting apparatus, a printed circuit board test assisting method and a computer-readable information recording medium according to the present invention.

Embodiment 1

Figure 1:
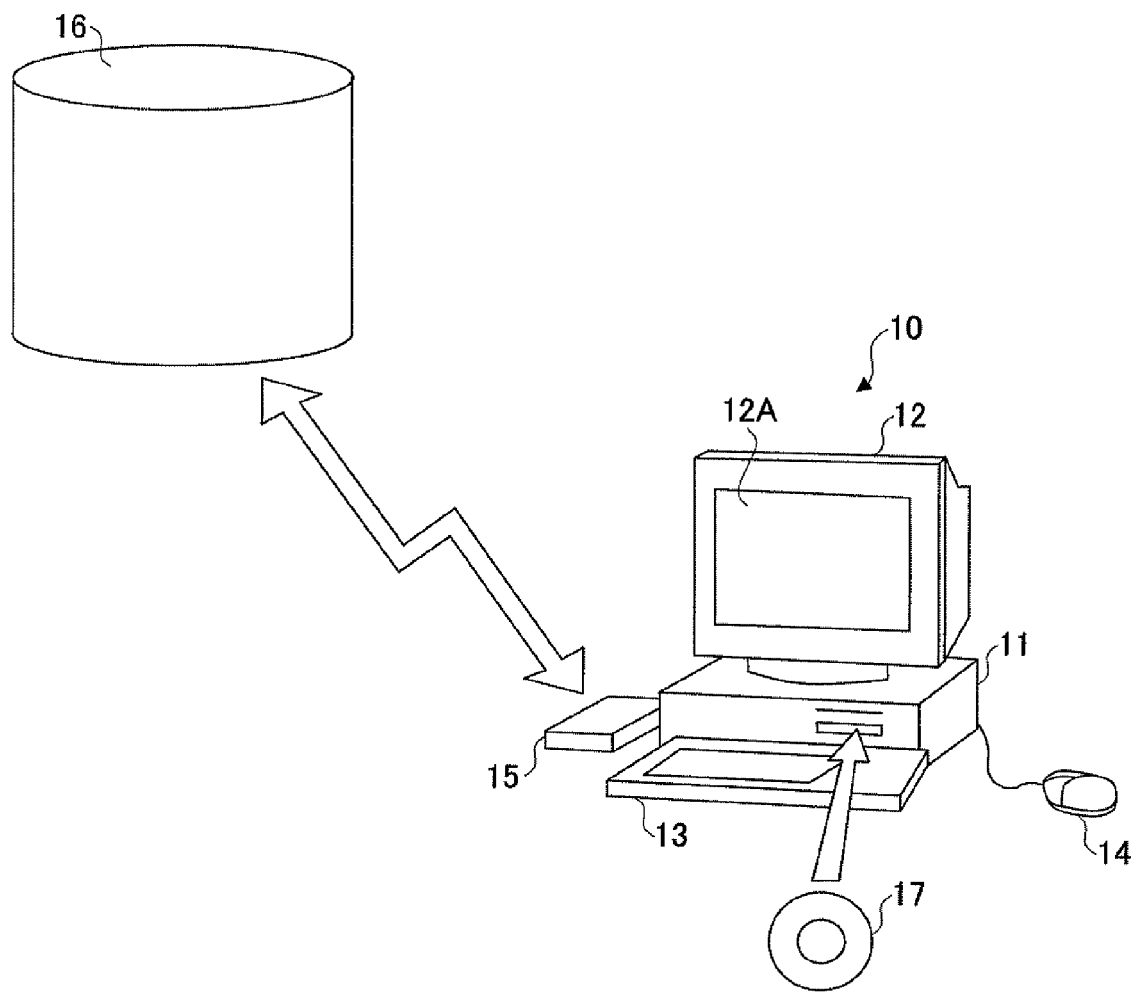
FIG. 1 depicts a perspective view of a computer system to which a printed circuit board test assisting apparatus in an embodiment 1 is applied.

FIG. 1 depicts a perspective view of a computer system to which a printed circuit board test assisting apparatus in an embodiment 1 is applied. The computer system 10 depicted in FIG. 1 includes a body part 11, a display 12, a keyboard 13, a mouse 14 and a modem 15.

The body part 11 has, built-in, a CPU (Central Processing Unit), a HDD (Hard Disk Drive), a disk drive or such. The display 12 acts as a display part that displays an analysis result or such on a display screen 12A in response to an instruction given by the body part 11. The display 12 may be, for example, a liquid crystal display monitor. The keyboard 13 acts as an input part for inputting various sorts of information to the computer system 10. The mouse 14 acts as an input part for designating any position on the display screen 12A of the display 12. The modem 15 is used to access an external database or such, and download a program or such stored in another computer system.

The printed circuit board test assisting program (printed circuit board test assisting program software or tool) for causing the computer system 10 to have a function of assisting in a test of a printed circuit board is stored in a portable recording medium such as a disk 17 or such, or is downloaded from a recording medium 16 of another computer system by using a communication device such as the modem 15, is thus input to the computer system 10 and is compiled.

The printed circuit board test assisting program causes the computer system 10 (i.e., a CPU 21 described later) to operate as a printed circuit board test assisting apparatus having a function of assisting in a test of a printed circuit board. The printed circuit board test assisting program may be, for example, stored in a computer-readable information recording medium such as the disk 17. The computer-readable information recording medium is not limited to a portable recording medium such as the disk 17, an IC card memory, a magnetic disk such as a floppy (registered trademark) disk, a magneto-optical disc, a CD-ROM or such, and may be any one of various types of recording media to which accessing can be carried out from a computer system connected via the modem 15 or a communication device for a LAN or such.

Figure 2:
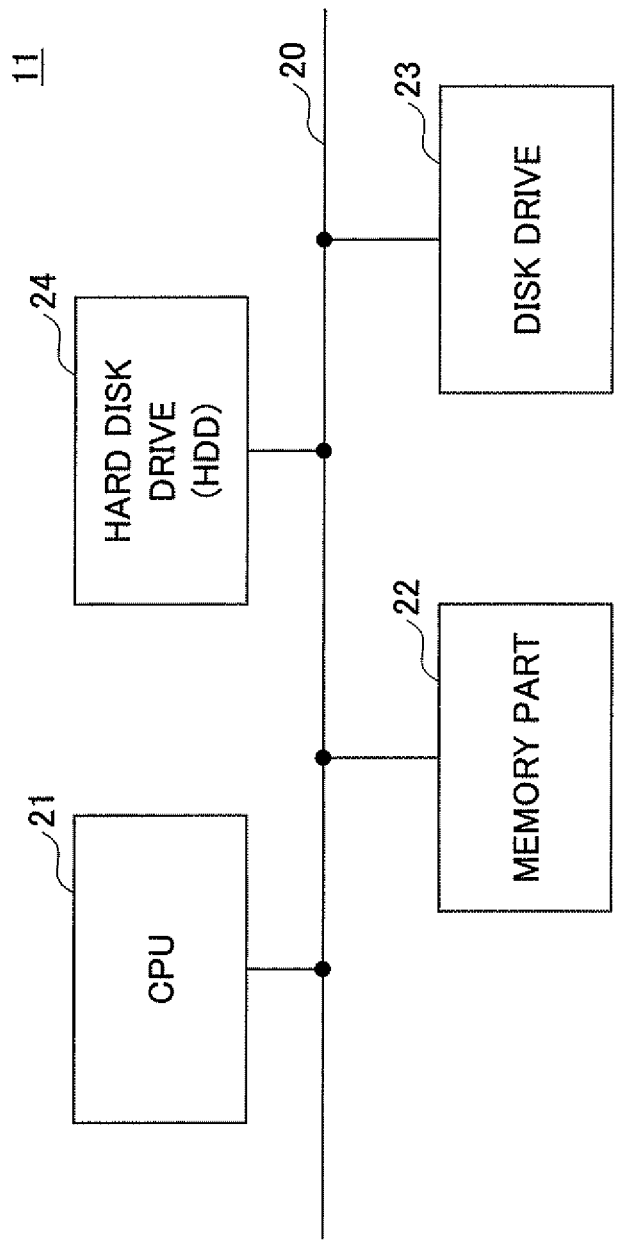
FIG. 2 depicts a block diagram roughly illustrating a configuration of a body part 11 of the computer system 10.

FIG. 2 is a block diagram roughly illustrating a configuration in the body part 11 of the computer system 10. The body part 11 includes a processor (CPU) 21, a memory part 22 including a RAM, ROM or such, a disk drive 23 for the disk 17, and a hard disk drive (HDD) 24, which are connected together by using a bus 20. In the embodiment 1, the display 12, the keyboard 13 and the mouse 14 are connected with the CPU by using the bus 20. However, these parts may be directly connected with the CPU 21. Further alternatively, the display 12 may be connected with the CPU 21 by using a known graphic interface (not depicted) that processes input/output image data.

In the computer system 10, the keyboard 13 and the mouse 14 act as an input part of the printed circuit board test assisting apparatus. The display 12 acts as a display part of the printed circuit board test assisting apparatus which displays on the display screen 12A a calculation result obtained from the printed circuit board test assisting function. The CPU 21 acts as, at least, a degradation degree process part that obtains degradation degrees of signal characteristics in wiring patterns, based on attribute information and position information of wiring patterns stored in a first database and position information of pattern removed areas stored in a second database; and an extracting process part that extracts wiring patterns having degradation degrees equal to or more than a predetermined degree from among plural wiring patterns for which degradation degrees have been obtained by the degradation degree process part.

The computer system 10 is not limited to one having a configuration depicted in FIGS. 1 and 2, and various known devices may be added, or may be used alternatively.

FIGS. 3A, 3B depict an electronic apparatus for which calculation for assisting in a test of a printed circuit board is carried out in the printed circuit board test assisting apparatus in the embodiment 1. FIG. 3A depicts a perspective see-through view of the electronic apparatus and FIG. 3B depicts a printed circuit board included in the electronic apparatus. In the embodiment 1, as one example of the electronic apparatus, a cellular phone terminal 1 is depicted.

As depicted in FIG. 3A, a display part 3 and operating parts 4 are provided on an external surface of a housing 2 of the cellular phone terminal 1. In the inside of the housing 2, a printed circuit board 5 is housed as depicted by a broken line.

The housing 2 is made of a resin or a metal, and has openings for providing the display part 3 and the operating parts 4. The display part 3 may be, for example, a liquid crystal display panel that has a function of displaying characters, numerals, images and so forth. The operating parts 4 include various selecting keys for selecting functions of the cellular phone terminal 1, in addition to ten keys. It is noted that the cellular phone terminal 1 may include auxiliary equipment such as a near field communication device (infra-red-ray communication device, a communication device for electronic money or such), or a camera.

The printed circuit board 5 depicted in FIG. 3B is made of, for example, a FR4 (glass fabric base epoxy resin) substrate, and wiring patterns 6 are formed on a surface 5A as a result of copper foil being patterned. The wiring patterns 6 act as transmission paths for transmitting various signals used for driving the electronic apparatus. The wiring patterns 6 are thus patterned by, for example, using an etching process that uses a resist.

An IC (Integrated Circuit) having a function of communications carried out by using the cellular phone terminal 1 such as telephone conversation, electronic mail, the Internet or such, a memory and so forth, are electrically connected to the wiring patterns 6.

In the FR4 substrate used as the printed circuit board 5, generally speaking, plural insulating layers are laminated, and patterned copper foils are provided between the respective insulating layers (interlayer), on the uppermost surface of the laminated structure, and on the lowermost surface of the laminated structure.

Therefore, wiring and circuits, used for carrying out communications, such as telephone conversation, electronic mail, the Internet, or such, may be formed, not only on the uppermost surface of the laminated structure, but also between the respective layers (interlayer) and/or on the lowermost surface of the laminated structure.

Further, the printed circuit board 5 is not limited to FR4, and any other substrate may be used as the printed circuit board 5 as long as the substrate is made of a dielectric, the wiring patterns 6 can be formed thereon, and circuits can be mounted thereon.

Further, the wiring patterns 6 are not limited to those made of copper (Cu). Any other metal may be used for the wiring patterns 6 as long as the metal has low power loss and high electric conductivity, for example, aluminum (Al) or such.

CAD (Computer Aided Design) data of the wiring patterns 6 formed in the printed circuit board 5 is stored in the HDD 24 depicted in FIG. 2.

It is noted that, in the printed circuit board 5, actually, plural layers are laminated together, and solid patterns for GND (ground) and power supply are also formed. Details thereof will be described next with reference to FIG. 4.

Figure 4:
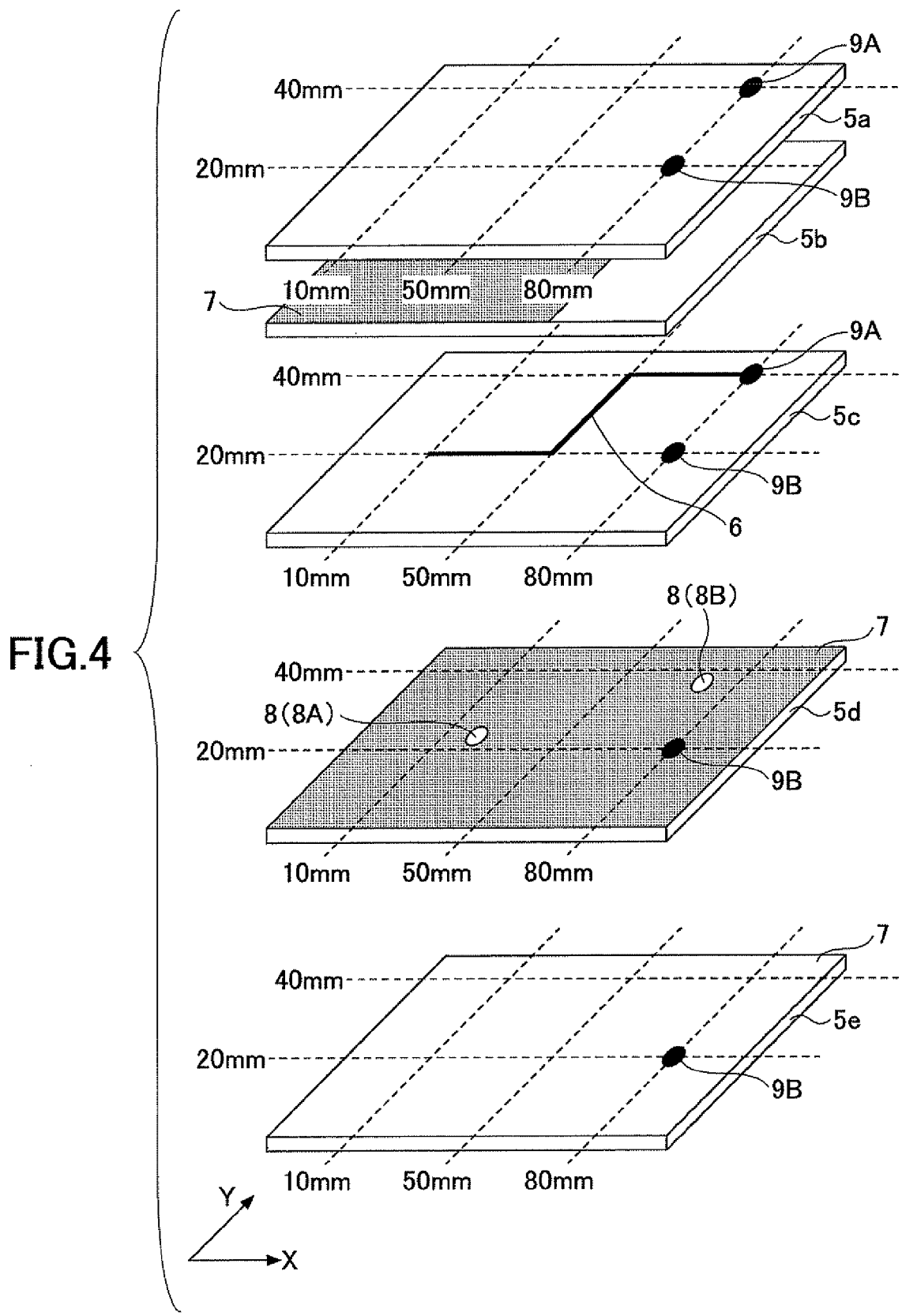
FIG. 4 depicts an exploded perspective view of a structure of a printed circuit board for which calculation is carried out for assisting in a test of the printed circuit board by the printed circuit board test assisting apparatus in the embodiment 1.

FIG. 4 depicts a perspective exploded view of a printed circuit board for which calculation is carried out for assisting in a test of the printed circuit board by using the printed circuit board test assisting apparatus in the embodiment 1.

The printed circuit board 5 depicted in FIG. 4 has a five layer structure. The printed circuit board 5 includes wiring patterns 6 and solid patterns 7. In the printed circuit board 5 depicted in FIG. 4, the wiring patterns 6 and the solid patterns 7 are formed on any of dielectric layers 5*a* through 5*e*. The dielectric layers 5*a* through 5*e* are made of any of core materials and adhesion layers.

The wiring patterns 6 are wiring or patterns having predetermined shapes used to transmit signals. The solid patterns 7 are formed to be planes, are kept at a ground electric potential and act as returning paths. Therefore, the wiring patterns 6 and solid patterns 7 are designed so that signal characteristics in the wiring patterns 6 are satisfactory (typically, impedance matching is obtained (for example, 50Ω)).

FIG. 4 depicts the printed circuit board 5 in a state in which the five layers of the printed circuit board 5, i.e., the uppermost dielectric layer 5*a*, the second dielectric layer 5*b*, the third dielectric layer 5*c*, the fourth dielectric layer 5*d* and the fifth dielectric layer 5*e*, are separated. On the dielectric layer 5*c*, wiring patterns 6 are formed. On the dielectric layers 5*b* and 5*d*, solid patterns 7 are formed, respectively. In the solid pattern 7 formed on the dielectric layer 5*d*, solid pattern removed areas 8 (8A, 8B) are formed. The solid pattern removed areas 8A and 8B are areas in the solid pattern 7 in which the solid pattern 7 is removed, for the purpose of passing interlayer wiring therethrough, for example. It is noted that, in the description below, the reference numeral 8 is used to denote solid pattern removed areas in a case where the solid pattern removed areas 8A and 8B are not distinguished therebetween.

Further, in the printed circuit board 5, a signal via 9A and a GND (ground) via 9B are formed. The signal via 9A passes through the dielectric layers 5*a* and 5*b*, and is connected to the wiring patterns 6 on the dielectric layer 5*c*. Various signals used for driving the electronic apparatus are input from the signal via 9A on the dielectric layer 5*a*. The GND via 9B is formed to pass through the dielectric layers 5*a* through 5*e*, and is connected to the respective solid patterns 7 on the dielectric layers 5*b* and 5*d*. As a result of the GND via 5B on the dielectric layer 5*a* being grounded, the respective solid patterns 7 on the dielectric layers 5*b* and 5*d* are kept at ground electric potential.

Here, for the sake of convenience in explanation, wiring patterns 6 formed on the dielectric layers 5*a* and 5*e* are omitted from FIG. 4. However, actually, in the printed circuit board 5, layers on which wiring patterns 6 are formed which are used as signal lines or such, and layers on which solid patterns 7 are formed, are laminated alternately.

Further, although FIG. 4 depicts the solid patterns 7 that are kept at ground electric potential, the printed circuit board 5 may include, in addition to the solid patterns 7 kept at ground electric potential, solid patterns for power supply that are kept at a predetermined positive or negative electric potential.

Further, the lowermost dielectric layer 5*e* may not be included in the printed circuit board 5 depicted in FIG. 4, and thus, wiring patterns 6 may be formed on the reverse side of the dielectric layer 5*d*.

It is noted that coordinates in an X axis direction and a Y axis direction depicted in FIG. 4 will be described with reference to FIGS. 5A, 5B and 5C.

FIGS. 5A-5C depict one example of CAD data used by the printed circuit board test assisting apparatus in the embodiment 1. The CAD data includes a size of each layer included in the printed circuit board 5, positions and sizes of vias or such formed in the printed circuit board 5, layer numbers, signal types, data rates, dielectric constants, electric conductivities, wiring widths, copper foil thicknesses (wiring thicknesses), interlayer distances, wiring heights, start-point coordinates, end-point coordinates, and so forth of respective wiring patterns formed in the printed circuit board 5.

The CAD data of the printed circuit board 5 is stored in the HDD 24 depicted in FIG. 2.

A table depicted in FIG. 5A corresponds to a first database in which identifiers, layer numbers, signal names, data rates, dielectric constants, wiring widths, wiring thicknesses, interlayer distances, start-point coordinates and end-point coordinates of the wiring patterns 6 are associated together, as depicted in FIG. 5A. The signal names indicate signal types of signals transmitted by the wiring patterns 6, and are included in the first database as one example of attribute information indicating attributes of the wiring patterns 6. The wiring widths, wiring thicknesses, interlayer distances, wiring heights, start-point coordinates and end-point coordinates are included in the first database as one example of position information of the wiring patterns 6. It is noted that the interlayer distance means a distance between solid patterns 7. That is, in FIG. 4, the interlayer distance indicates a distance between the respective solid patterns 7 on the dielectric layers 5b and 5d. The wiring height means a height of the wiring patterns 6 with respect to the solid pattern 7. In FIG. 4, the wiring height indicates a height of the wiring patterns 6 on the dielectric layer 5c with respect to the solid pattern 7 on the dielectric layer 5d.

A table depicted in FIG. 5B corresponds to a second database in which identifiers, layer numbers, diameters and center coordinates of solid pattern removed areas are associated together. The identifiers, layer numbers, diameters and center coordinates of solid pattern removed areas indicate one example of position information and size information of solid pattern removed areas 8 formed in solid patterns 7.

A table depicted in FIG. 5C corresponds to a fourth database in which identifiers, layer numbers, connection destinations, diameters and center coordinates of vias are associated together. The identifiers, layer numbers, connection destinations, diameters and center coordinates of vias indicate one example of position information of signal vias 9A and GND vias 9B formed on respective dielectric layers. The connection destination depicted in FIG. 5C means a corresponding signal type or GND.

It is noted that as a third database, data denoting degradation degree information stored in the HDD 24 is provided. The degradation degree information will be described later with reference to FIG. 8.

X coordinate values and Y coordinate values of the start-point coordinates and end-point coordinates depicted in FIG. 5A, X coordinate values and Y coordinate values of the center coordinates depicted in FIG. 5B, and X coordinate values and Y coordinate values of the center coordinates depicted in FIG. 5C, indicate coordinates in the X axis and the Y axis depicted in FIG. 4.

The wiring patterns having identifiers No. 1 through No. 3 depicted in FIG. 5A indicate the wiring patterns 6 formed on the dielectric layer 5c depicted in FIG. 4. A data signal having a signal name "data001" is transmitted to the wiring patterns 6.

Solid pattern removed areas of identifiers No. 1 and No. 2 depicted in FIG. 5B indicate the solid pattern removed areas 8A and 8B formed on the dielectric layer 5d depicted in FIG. 4.

A via of an identifier No. 1 depicted in FIG. 5C indicates the signal via 9A depicted in FIG. 4, and a via of an identifier No. 2 indicates the GND via 9B depicted in FIG. 4.

As depicted in FIG. 4, the wiring patterns 6 and the solid pattern removed areas 8A, 8B are close together. As to this positional relationship, as can also be seen from the coordinate values depicted in FIGS. 5A and 5B, the wiring pattern 6 of No. 1 and the solid pattern removed area of No. 1 (8A) are close together, and the wiring pattern 6 of No. 3 and the solid pattern removed area of No. 2 (8B) are close together.

As the wiring patterns 6 and the solid pattern removed areas 8A, 8B are thus close together, a state of characteristic impedance mismatching may occur in the wiring patterns 6. Such impendence mismatching may cause signal characteristic degradation.

A case where signal characteristic degradation occurs in the wiring patterns 6 because of the solid pattern removed areas is a case where, in the printed circuit board 5 depicted in FIG. 4, the solid pattern removed areas 8A, 8B exist in the dielectric layer 5c, the dielectric layer 5b or the dielectric layer 5d, which is the same dielectric layer 5c on which the wiring patterns 6 is formed, the dielectric layer 5b one layer above the dielectric layer 5c or the dielectric layer 5d one layer below the dielectric layer 5c, and also, the wiring patterns 6 and the solid pattern removed areas 8A, 8B are close together in a plan view manner.

The printed circuit board test assisting apparatus in the embodiment 1 obtains a wiring pattern having a large characteristic impedance degradation degree by calculation for the purpose of improving work efficiency in an actual measurement test after manufacturing the printed circuit board 5. In calculating the characteristic impedance degradation degree, a range in a width direction with respect to the wiring pattern 6 is determined. As to determination of the range in the width direction, description will be made later with reference to FIG. 9. Here, previously, a configuration of the printed circuit board test assisting apparatus in the embodiment 1 will now be described with reference to FIG. 6.

Figure 6:
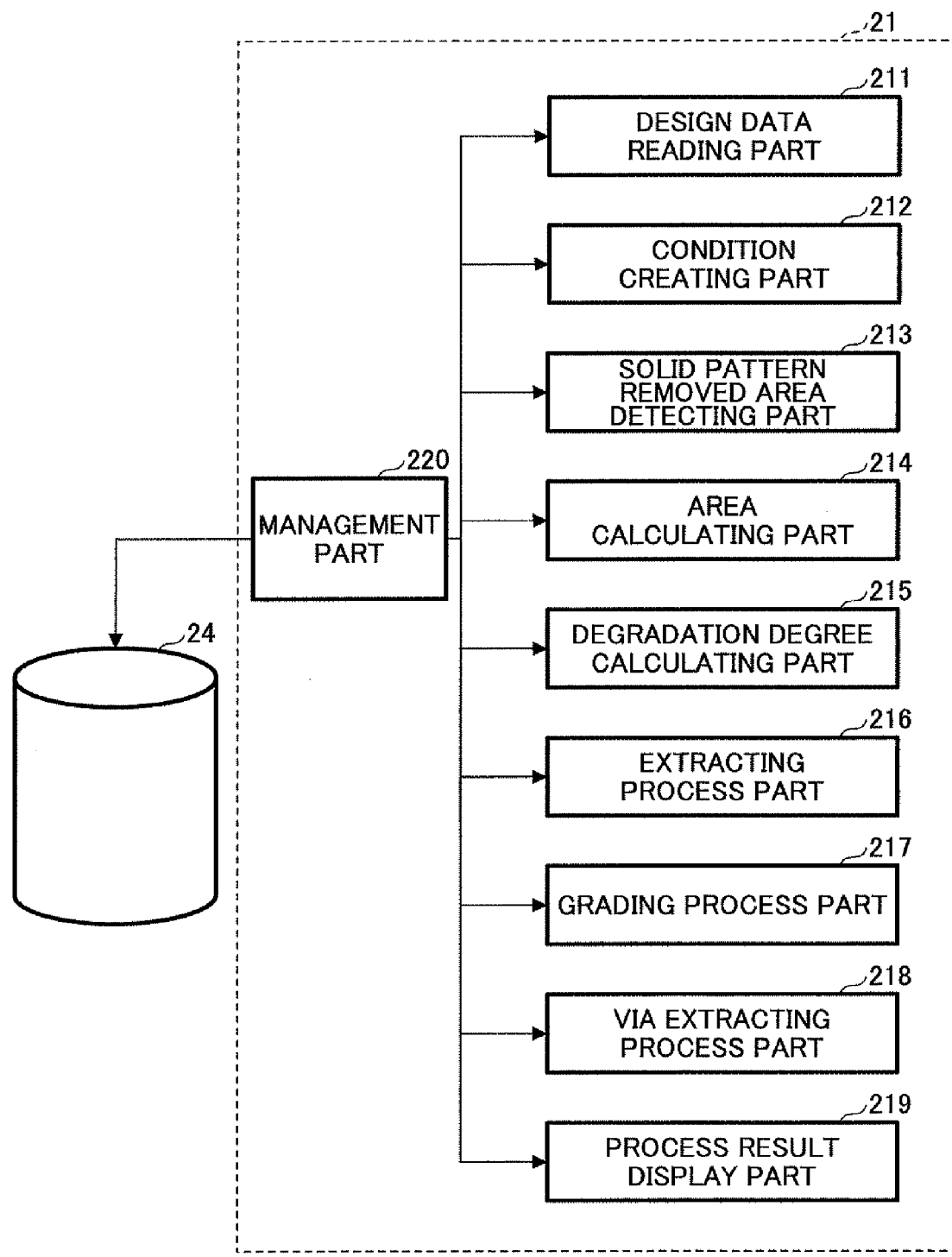
FIG. 6 depicts a functional block diagram of the printed circuit board test assisting apparatus in the embodiment 1.

FIG. 6 is a functional block diagram depicting functions of the printed circuit board test assisting apparatus in the embodiment 1. The functional block is realized as a result of the CPU 21 depicted in FIG. 2 executing the printed circuit board test assisting program stored in the HDD 24.

The functional block realized by the CPU 21 includes a design data reading part 211, a condition creating part 212, a solid pattern removed area detecting part 213, an area calculating part 214, a degradation degree calculating part 215, an extracting process part 216, a grading process part 217, a via extracting part 218, a process result displaying part 219, and a management part 220.

The design data reading part 211 reads the CAD data stored in the HDD 24.

The condition creating part 212 creates conditions used for calculating a characteristic impedance degradation degree described below, based on conditions input via the keyboard 13 or the mouse 14. As the input conditions, for example, the signal type of the signal transmitted by the wiring patterns 6, a range in a width direction used for calculating a characteristic impedance degradation degree, a threshold of impedance used for extracting for the purpose of grading, or such, may be cited.

The solid pattern removed area detecting part 213 classifies positional relationships of the solid pattern removed areas 8 with respect to the wiring patterns 6 in a plan view manner, based on the X coordinates and the Y coordinates of the wiring patterns 6 depicted in FIG. 5A, and the X coordinates and the Y coordinates of the solid pattern removed areas 8 depicted in FIG. 5B, and creates a classification result. Details will be described later with reference to FIG. 7.

The area calculating part 214 extracts the wiring patterns 6 as targets by using the signal type (signal name) of the signal transmitted by wiring patterns 6 created by the condition creating part 212, and calculates an area of a solid pattern removed area existing within the range in the width direction for used calculating the characteristic impedance degradation degree in the plan view manner.

The degradation degree calculating part 215 calculates the characteristic impedance degradation degrees of the wiring patterns 6 as the targets of calculation, by using the positional relationships between the wiring patterns 6 and the solid pattern removed areas 8 classified by the solid pattern removed area detecting part 213, and the area of the solid pattern removed area 8 calculated by the area calculating part 214.

The extracting process part 216 extracts a wiring pattern having the degradation degree equal to or more than a predetermined degree, from among the plural wiring patterns for which the degradation degrees have been obtained by the degradation degree calculating part 215.

The grading process part 217 carries out grading of the wiring patterns 6, and creates data in which the wiring patterns 6 are sorted in a descending order according to a magnitude of a shift from a target value (50Ω) of the characteristic impedance.

The via extracting process part 218 extracts the signal via 9A connected to the wiring patterns 6 graded by the grading process part 217 and the GND via 9B nearest to the signal via 9A. As a result of the signal via 9A and the GND via 9B being thus extracted, the position of the signal via 9A and the position of the GND via 9B are extracted. The signal via 9A connected to the wiring patterns 6 graded by the grading process part 217 is identified as a result of the signal via 9A being extracted from the fourth database depicted in FIG. 5C which has the connection destination that is the same as the signal name of the wiring pattern 6. The nearest GND via 9B is identified as a result of the GND via 9B nearest to the position of the thus-extracted signal via 9A being extracted from the fourth database depicted in FIG. 5C.

The process result display part 219 displays on the display screen 12A of the display 12 depicted in FIG. 1 the numbers of the wiring patterns 6 graded by the grading process part 217, and the positions of the signal via 9A and the GND via 9B extracted by the via extracting process part 218. The display contents will be described later.

The management part 220 manages storing of data in the HDD 24.

Next, determination of a positional relationship between a wiring pattern and a solid pattern removed area in the printed circuit board test assisting apparatus in the embodiment 1 will be described. Determination of the positional relationship is carried out by the solid pattern removed area detecting part 213 (see FIG. 6).

FIG. 7 depicts one example of a result of classification of positional relationships between wiring patterns and solid pattern removed areas in the printed circuit board test assisting apparatus in the embodiment 1.

The solid pattern removed area detecting part 213 classifies positions of the solid pattern removed areas 8 with respect to the wiring patterns 6 in the plan view manner based on the X coordinates and Y coordinates of the wiring patterns 6 depicted in FIG. 5A and the X coordinates and Y coordinates of the solid pattern removed areas 8 depicted in FIG. 5B.

Further, in addition to the classification of the positional relationships in the plan view manner, the solid pattern removed area detecting part 213 determines whether the solid pattern removed areas 8 exist in the same layer as that of the wiring patterns 6, the layer that is one layer above it, or the layer that is one layer below it (i.e., whether the solid pattern removed areas and the wiring patterns are not separated from each other by equal to or more than two layers).

Specifically, the solid pattern removed area detecting part 213 calculates positional relationships in the X-Y coordinates between the X coordinates and the Y coordinates of the start points and the end points that indicate respective sections of the wiring patterns 6 depicted in FIG. 5A, and the X coordinates and the Y coordinates of the solid pattern removed areas 8 depicted in FIG. 5B, and thus, classifies the positions of the solid pattern removed areas 8 with respect to the wiring patterns 6 in the plan view manner. The positions of the solid pattern removed areas 8 with respect to the wiring patterns 6 in the plan view manner are classified in any one of, on one side of the wiring, on both sides of the wiring, or immediately above or immediately below the wiring.

Further, the solid pattern removed area detecting part 213 determines whether a value obtained from subtracting the layer number of the solid pattern removed area 8 depicted in FIG. 5B from the layer number of the wiring pattern 6 depicted in FIG. 5A, is any one of 0, +1, and −1. In a case where the value is equal to or more than +2 or equal to or less than −2, it is expected that another solid pattern 7 exists between the wiring pattern 6 and the solid pattern removed area 8. Therefore, it is expected that no relationship exists in signal characteristic degradation between the wiring pattern 6 and the solid pattern removed area 8 for which the determination is carried out.

By carrying out the determinations, the solid pattern removed area detecting part 213 classifies the positional relationships between the wiring patterns 6 and the solid pattern removed areas 8, and creates data indicating the classification result depicted in FIG. 7.

Figure 8:
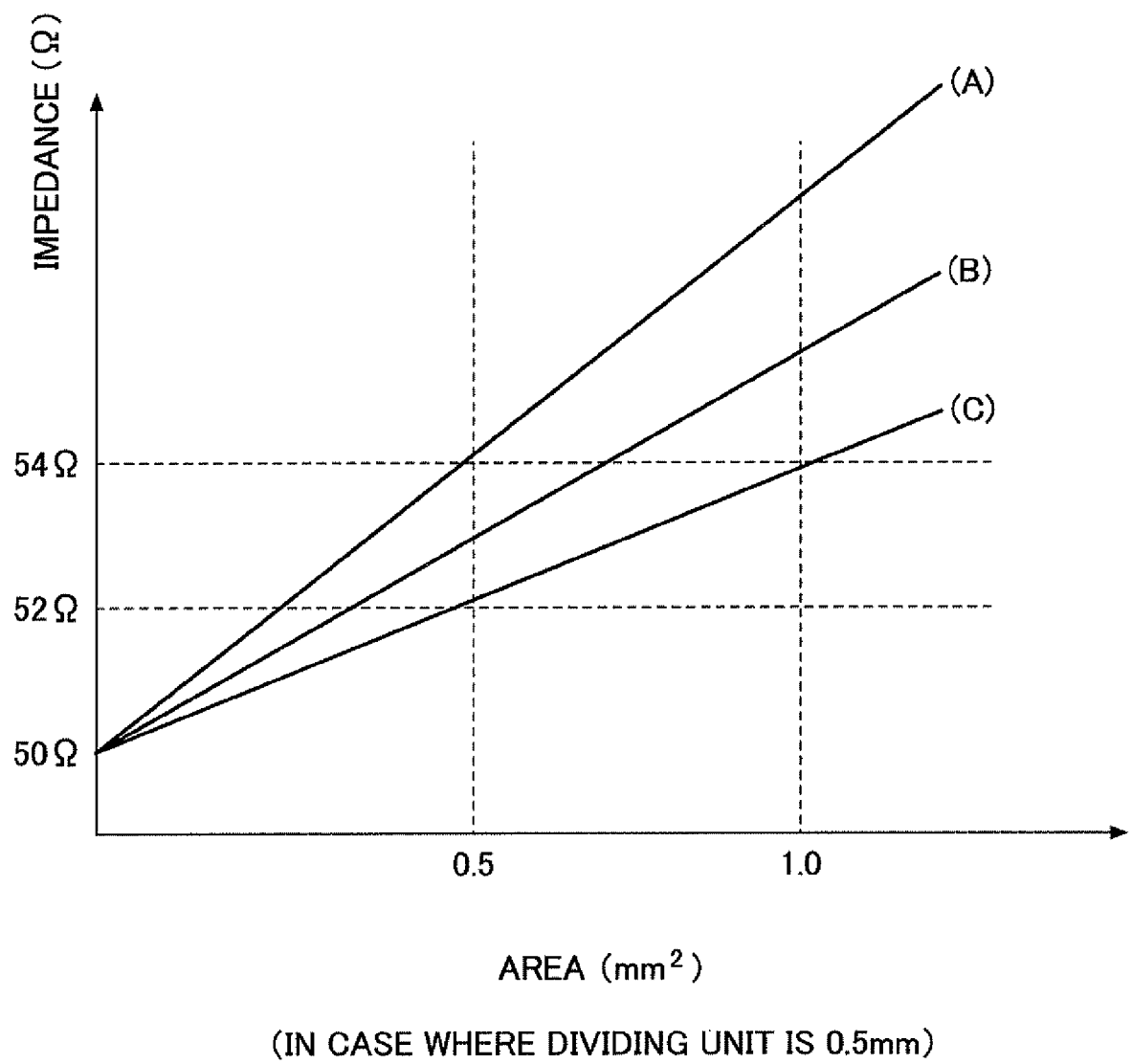
FIG. 8 depicts a characteristic impedance increased characteristics stored in a database 20 of the printed circuit board test assisting apparatus in the embodiment 1.

FIG. 8 depicts characteristic impedance increased characteristics stored in the database 20 of the printed circuit board test assisting apparatus in the embodiment 1. The data indicating the increased characteristics is used to calculate the characteristic impedance degradation degree, and indicates a characteristic impedance increase (degradation) per unit area of the solid pattern removed area 8 with respect to the positional relationship between the wiring pattern 6 and the solid pattern removed area 8. The data indicating the increased characteristics depicted in FIG. 8 is one form of degradation degree information indicating a degradation degree in signal characteristics in the wiring pattern 6 with respect to the positional relationship between the wiring pattern 6 and the solid pattern removed area 8 and a size of the solid pattern removed area 8, and is stored in the HDD 24 as a third database.

The positional relationship between the wiring pattern 6 and the solid pattern removed area 8 is classified in any one of three patterns, i.e., (A) the solid pattern removed area 8 exists immediately above or immediately below the wiring pattern 6; (B) the solid pattern removed areas 8 exist on both sides of the wiring pattern 6; and (C) the solid pattern removed area 8 exists only on one side of the wiring pattern 6 (see FIG. 7). It is noted that such a positional relationship between the wiring pattern 6 and the solid pattern removed area 8 that it is expected that no relationship exists in signal characteristic degradation between the wiring pattern 6 and the solid pattern removed area 8 is not included in the above-mentioned three patterns (A), (B) and (C). It is assumed that an ideal characteristic impedance of the wiring pattern is 50Ω. As a result, because a characteristic impedance mismatching degree increases in the stated order of the patterns (C), (B) and (A), the characteristics depicted in FIG. 8 have an increased coefficient (a slope of the characteristics) such that the characteristic impedance in the positional relationship (A) is the highest, and the characteristic impedance decreases in the stated order of the positional relationships (B) and (C).

The printed circuit board test assisting apparatus in the embodiment 1 calculates the characteristic impedance degradation degree in the wiring pattern 6 based on the area of the solid pattern removed area 8 that exists within a range determined as a range for calculating the characteristic impedance degradation degree, and the positional relationship of the solid pattern removed area 8 with respect to the wiring pattern 6.

Figure 9:
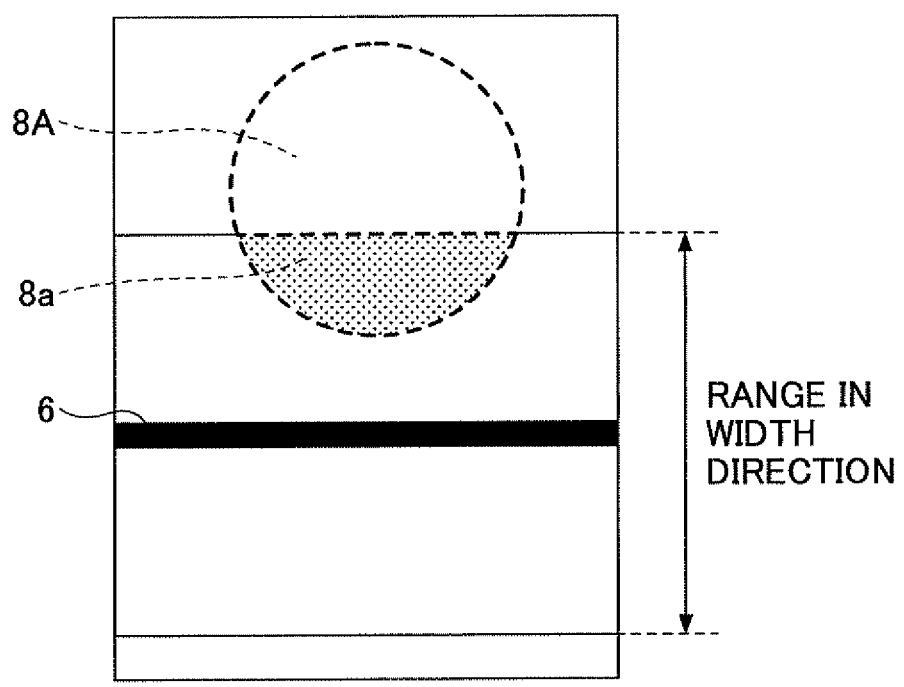
FIG. 9 illustrates a range in a width direction for which a characteristic impedance degradation degree is calculated in the printed circuit board test assisting apparatus in the embodiment 1.

FIG. 9 illustrates a range in a width direction for calculating the characteristic impedance degradation degree in the printed circuit board test assisting apparatus in the embodiment 1. FIG. 9 depicts, in a magnified manner, the positional relationship between the wiring pattern 6 formed on the dielectric layer 5c and the solid pattern removed area 8A formed in the dielectric layer 5d depicted in FIG. 4, and a range in a width direction for calculating the characteristic impedance degradation degree (i.e., a range in a width direction for which calculation is carried out).

In the printed circuit board test assisting apparatus in the embodiment 1, the characteristic impedance degradation degree is calculated after the range in the width direction for which the calculation is carried out is previously determined.

The range in the width direction for which the calculation is carried out is input via a parameter input part 10 (see FIG. 1).

For example, it is assumed that the range in the width direction is input as 40 times (4.0 mm) a wiring width (0.1 mm) of the wiring pattern 6.

As depicted in FIG. 9, a part 8a (filled with halftone dots) of the solid pattern removed area 8A close to the wiring pattern 6 is included within 4.0 mm (the range in the width direction) from the wiring pattern 6 in the plan view manner.

In the printed circuit board test assisting apparatus in the embodiment 1, the characteristic impedance degradation degree (or characteristic impedance changing amount) in the wiring pattern 6 caused by the part 8a of the solid pattern removed area 8A is obtained, which part is included in the range in the width direction for which the calculation is carried out. By thus determining the characteristic impedance degradation degree, it is possible to grasp an influence on the signal characteristics of the wiring pattern 6.

Figure 10:
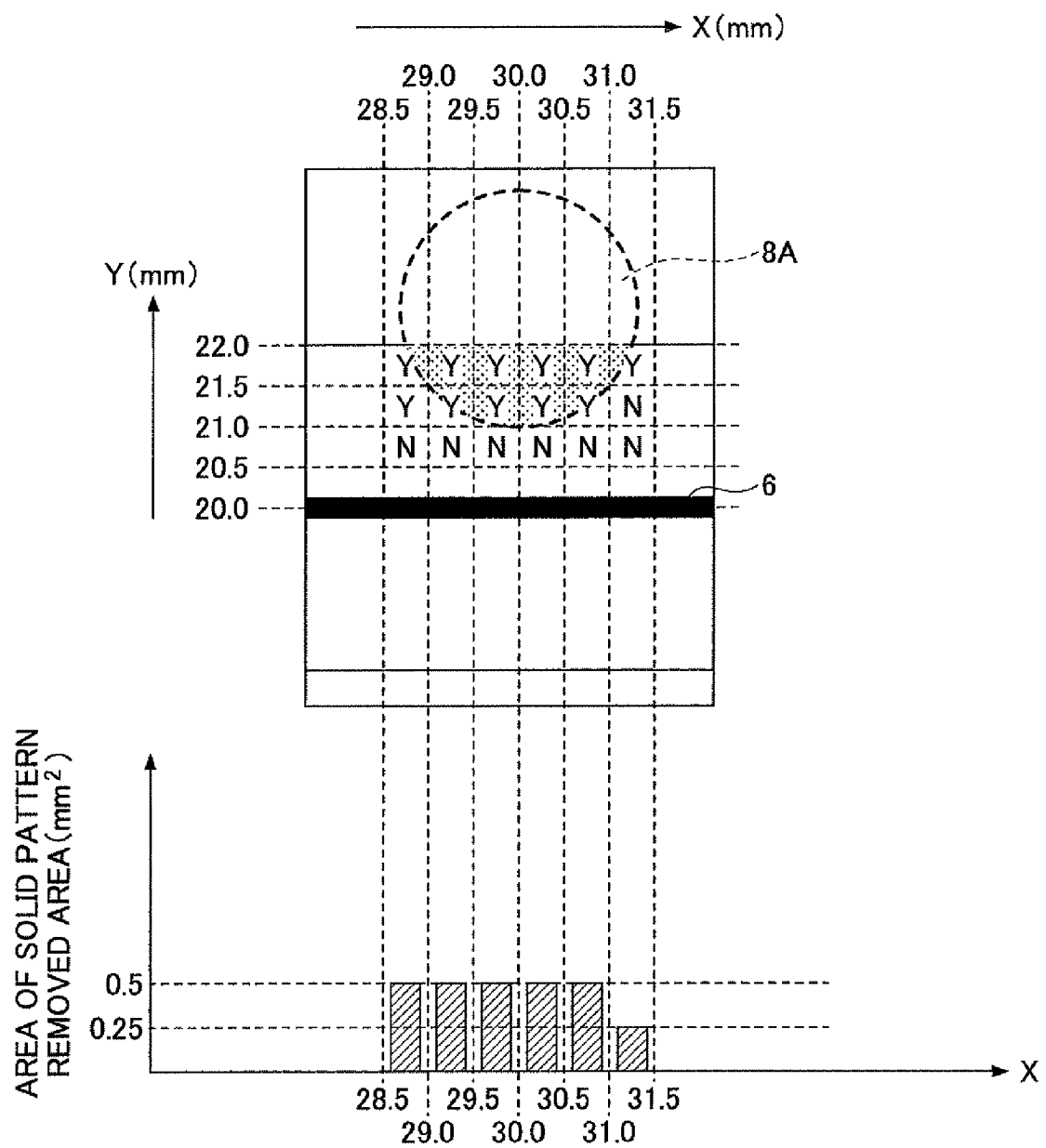
FIG. 10 illustrates a method of calculating an area of a solid pattern removed area existing in a range for which a characteristic impedance degradation degree is calculated in the printed circuit board test assisting apparatus in the embodiment 1.

FIG. 10 illustrates a method of calculating an area of a part of a solid pattern removed area, which part exists within the range in the width direction for which the printed circuit board test assisting apparatus in the embodiment 1 calculates the characteristic impedance degradation degree.

The solid pattern removed area detecting part 213 detects the part of the solid pattern removed area 8, which part is included in the range in the width direction for which the characteristic impedance degradation degree is calculated, and the area calculating part 214 calculates the part of the solid pattern removed area 8 based on the detection result of the solid pattern removed area detecting part 213.

In the detection and calculation of the part of the solid pattern removed area 8, an area included in the range in the width direction is divided into square meshes having predetermined areas, from the start point to the end point of the wiring pattern 6 for which the characteristic impedance degradation degree is calculated. Then, the wiring pattern 6 is divided into sections having lengths equal to sides of the meshes, respectively, and it is determined whether the solid pattern removed area 8 exists for each mesh.

In the determination of whether the solid pattern removed area 8 exists for each mesh, it is determined that the solid pattern removed area 8 exists in the mesh when the solid pattern removed area 8 exists in at least a part of the mesh. That is, a case where it is determined that the solid pattern removed area 8 does not exist in the mesh is a case where the solid pattern removed area 8 does not exist in the mesh at all. In FIG. 10, "Y" denotes a state in which the solid pattern removed area 8 exists in at least a part of the mesh (simply referred to as "the solid pattern removed area 8 exists", hereinafter), and "N" denotes a state in which the solid pattern removed area 8 does not exist in the mesh at all (simply referred to as "the solid pattern removed area 8 does not exist", hereinafter).

It is noted that a length of a side of the mesh is determined to be, for example, a value indicated by the following formula (1):

$$\text{(length of a side of the mesh)} = \text{(rise time)} \times \text{(propagation velocity in transmission path)} / \text{(any dividing number)} \quad (1)$$

Here, the length of a side of the mesh is determined as 0.5 mm, and therefore, the wiring pattern 6 is divided in the length direction into sections each having 0.5 mm, and the area calculating part 214 calculates an area of the solid pattern removed area 8 for each section.

As a coordinate identifying the mesh, a coordinate having the smallest value is used from among respective coordinates of the four corners of the mesh. In the example of FIG. 10, a coordinate value of a bottom left vertex of the mesh is used as a coordinate to identify the mesh.

In the example of FIG. 10, for the meshes included in a range of X=28.5 through 31.5, and Y=20.0 through 22.0, it is determined whether the solid pattern removed area 8 exists in the mesh for each section divided every 0.5 mm in the X-axis direction. It is noted that, in FIG. 10, "Y" is indicated for the mesh for which it is determined that the solid pattern removed area 8 exists, and "N" is indicated for the mesh for which it is determined that the solid pattern removed area 8 does not exist.

Further, a total area of the solid pattern removed areas 8 of "Y" for each section of the wiring pattern 6 (solid pattern removed area (mm$^2$) in FIG. 10) is, according to the number of meshes of "Y": 0.5 mm$^2$ for a range of X=28.5 through 29.0; 0.5 mm$^2$ for a range of X=29.0 through 29.5; 0.5 mm$^2$ for a range of X=29.5 through 30.0; 0.5 mm$^2$ for a range of X=30.0 through 30.5; 0.5 mm$^2$ for a range of X=30.5 through 31.0; and 0.25 mm$^2$ for a range of X=31.0 through 31.5.

FIG. 11 depicts the results of the determinations of FIG. 10 in a form of a table.

As depicted in FIG. 11, for the mesh for which the solid pattern removed area exists ("Y"), a flag "1" is given, while for the mesh for which the solid pattern removed area does not exist ("N"), a flag "0" is given. The flag is used by the degradation degree calculating part 215 to calculate the characteristic impedance degradation degree.

In the determination results depicted in FIG. 10, the total area of meshes of "Y" for each section of the wiring pattern 6 is calculated as a result of the number of the flags "1" indicating that the solid pattern removed area exists for each section being multiplied with the unit area (0.25 mm$^2$) of the mesh.

Figure 12:
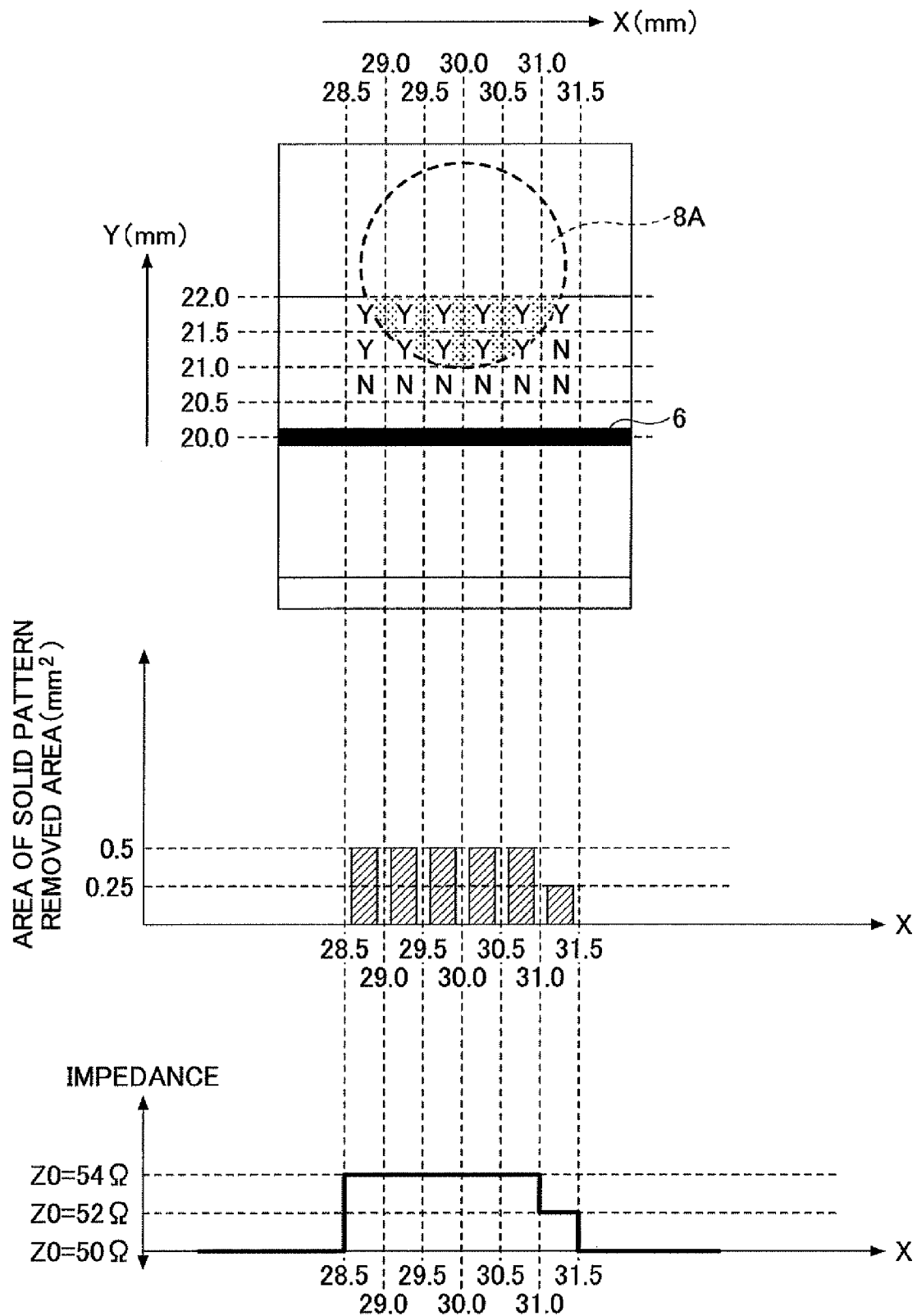
FIG. 12 depicts characteristic impedance of a wiring pattern that is influenced by a solid pattern removed area depicted in FIG. 10.

FIG. 12 depicts characteristic impedance of the wiring pattern 6 which is influenced by the solid pattern removed area 8 depicted in FIG. 10. The characteristic impedance of FIG. 12 is calculated by the degradation degree calculating part 215 based on the characteristics depicted in FIG. 8 and the determination results of FIG. 10.

As mentioned above, the degradation degree calculating part 215 calculates the characteristic impedance of the wiring pattern 6 by using the characteristics depicted in FIG. 8 and the determination results of FIG. 10.

The characteristic impedance of the wiring pattern per each section of the wiring pattern 6 is obtained from the following formula (2):

(characteristic impedance)=(increased coefficient)×(area of solid pattern removed area(mm$^2$)for the section)×(offset value)  (2)

There, the "increased coefficient" is the increased coefficient of any one of the characteristics (A), (B) and (C) depicted in FIG. 8. The "area of solid pattern removed area (mm$^2$)" is "area of solid pattern removed area (mm$^2$)" depicted in FIG. 10 and FIG. 12. The "offset value" is determined as 50Ω.

As the solid pattern removed area 8A exists on one side of the wiring pattern 6 as depicted in FIG. 10 and FIG. 12, the characteristic (C) of FIG. 8 is used (increased coefficient=2/0.5=4, according to FIG. 8): 52Ω (i.e., 4×0.5+50=52) for X=28.5 through 29.0; 52Ω for X=29.0 through 29.5; 52Ω for X=29.5 through 30.0; 52Ω for X=30.0 through 30.5; 52Ω for X=30.5 through 31.0; 51Ω (i.e., 4×0.25+50=51) for X=31.0 through 31.5, as depicted as "impedance" in FIG. 12.

Thus, the characteristic impedance of the wiring pattern 6 for each section is obtained.

The degradation degree calculating part 215 carries out the above-mentioned operation from the start point to the end point of the wiring pattern 6, the values of the respective sections are integrated, and the characteristic impedance of the wiring pattern 6 from the start point to the end point is obtained. After that, the degradation degree calculating part 215 calculates a difference (shift) of the characteristic impedance of the wiring pattern 6 from the target value (50Ω).

Next, a method of calculating for assisting in a test of a printed circuit board by the printed circuit board test assisting apparatus in the embodiment 1 will be described. Below, description will be made under the condition in which the printed circuit board test assisting program for causing the computer system depicted in FIG. 1 to act as the printed circuit board test assisting apparatus having the function of calculating for assisting in a test of a printed circuit board is stored in the HDD 24 depicted in FIG. 2.

Figure 13:
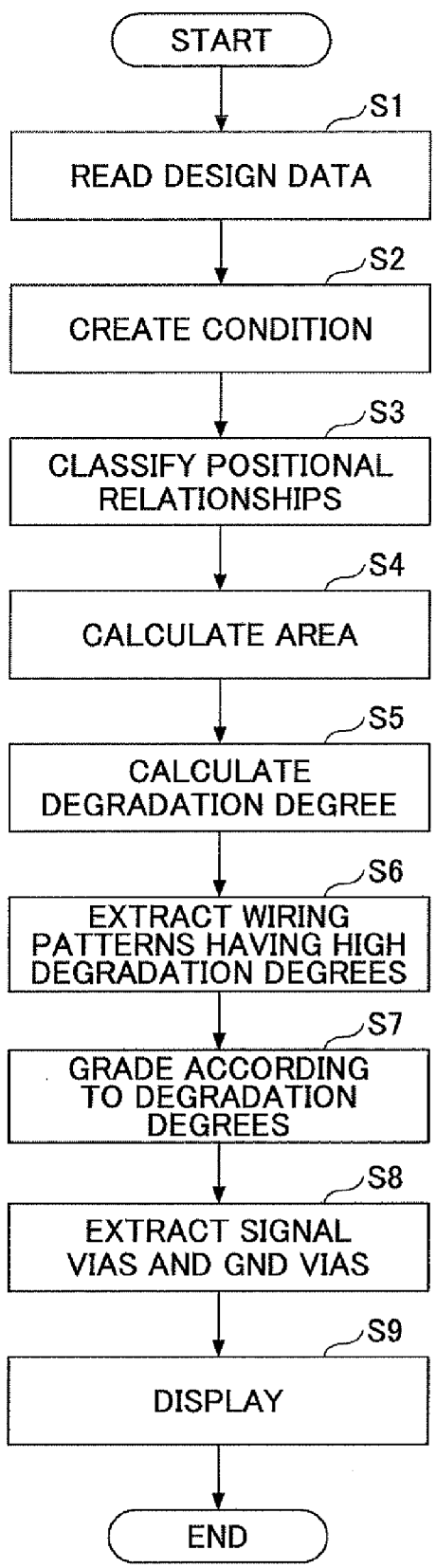
FIG. 13 depicts a flowchart of a calculating process for assisting in a test of a printed circuit board in the printed circuit board test assisting apparatus in the embodiment 1.

FIG. 13 depicts a flowchart indicating calculation for assisting in a test of a printed circuit board by the printed circuit board test assisting apparatus in the embodiment 1. The calculation depicted in FIG. 13 is performed as a result of the CPU 21 executing the printed circuit board test assisting program in the embodiment 1.

When starting the calculation, the CPU 21 reads the CAD data stored in the HDD 24 (step S1). That is, the design data reading part 211 of the CPU 21 reads the CAD data depicted in FIGS. 5A, 5B and 5C.

Next, the CPU 21 creates the conditions for calculating the characteristic impedance degradation degrees (step S2). That is, based on the conditions input via the keyboard 13 or the mouse 14, the conditions for calculating the characteristic impedance degradation degrees are created by the condition creating part 212 of the CPU 21. As the conditions thus input, for example, signal type of the signal transmitted by the wiring patterns 6, the range in the width direction for calculating the characteristic impedance degradation degrees, the threshold for the impedances used when extracting is carried out for grading, and so forth, may be cited.

Next, the CPU 21 classifies the positional relationships of the solid pattern removed areas 8 with respect to the wiring patterns 6 in the plan view manner, and creates data indicating the classification result (step S3). That is, the solid pattern removed area detecting part 213 of the CPU 21 creates the data indicated by the classification table of FIG. 7 based on X coordinates and Y coordinates of the wiring patterns 6 depicted in FIG. 5A, and X coordinates and Y coordinates of the solid pattern removed areas 8 depicted in FIG. 5B.

The CPU 21 extracts the wiring patterns 6 for which calculation is carried out according to the signal type of the signal transmitted by the wiring patterns 6 created by the condition creating part 212, and calculates an area of the solid pattern removed areas that exists in the plan view manner within the range in the width direction for which the characteristic impedance degradation degrees (i.e., the area of solid pattern removed area (mm$^2$) depicted in FIG. 10 and FIG. 12 in the embodiment) are calculated (step S4). This process is carried out by the area calculating part 214 of the CPU 21.

Next, the CPU 21 calculates the characteristic impedance degradation degrees of the wiring patterns 6 for which calculation is carried out based on the positional relationships between the wiring patterns 6 and the solid pattern removed areas 8 classified by the solid pattern removed area detecting part 213, and the areas of the solid pattern removed areas calculated by the area calculating part 214 (step S5). This process is carried out by the degradation degree calculating part 215 of the CPU 21.

The CPU 21 extracts the wiring pattern 6 having the characteristic impedance degradation degree equal to or more than the predetermined degree from among the plural wiring patterns 6 for which the degradation degree calculating part 215 calculates the characteristic impedance degradation degrees (step S6). This process is carried out by the extracting process part 216 of the CPU 21.

Next, the CPU 21 grades the wiring patterns 6 (step S7). In the grading, the CPU 21 creates data in which the wiring patterns 6 are sorted in the descending order according to the differences (shifts) of the characteristic impedances from the target value (50Ω). This process is carried out by the grading process part 217 of the CPU 21.

Next, the CPU 21 extracts the signal via 9A connected to the wiring patterns 6 graded in step S7, and the GND via 9B nearest to the signal via 9A (step S8). This process is carried out by the via extracting process part 218 of the CPU 21. In the process, the signal via 9A having the signal name the same as the signal name of the wiring patterns 6 is extracted from the fourth database depicted in FIG. 5C, and also, the GND via 9B nearest to the position of the extracted signal via 9A is extracted from the fourth database depicted in FIG. 5C.

Next, the CPU 21 displays a result of grading carried out by the grading process part 217 together with the signal via 9A and the GND via 9B extracted by the via extracting process part 218, on the display screen 12A of the display 12 depicted in FIG. 1 (step S9). This process is carried out by the process result display part 219 of the CPU 21, and the grading result and the extracting result, depicted in FIGS. 14A and 14B, are displayed on the display screen 12A of the display 12.

Thus, a series of processes carried out by the CPU 21 for calculating the characteristic impedance degradation degrees is finished.

Figures 14A, 14B:
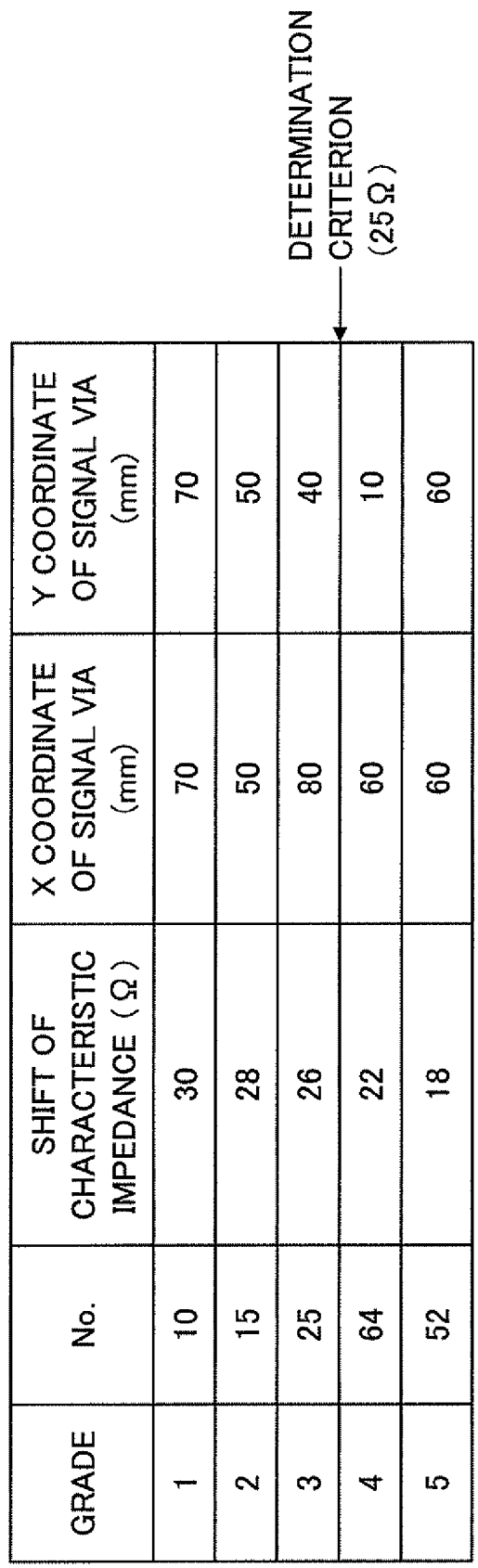
FIGS. 14A and 14B depict a grading result and an extracting result in the printed circuit board test assisting apparatus in the embodiment 1.

FIGS. 14A and 14B depict the grading result and extracting result provided by the printed circuit board test assisting apparatus in the embodiment 1. The grading result and the extracting result depict the grading result provided by the grading process part 217 and the extracting result provided by the via extracting process part 218, together in FIGS. 14A and 14B.

FIG. 14A depicts the grading result from the first through the fifth places of wiring patterns 6 of Nos. 10, 15, 25, 64 and 52, and an extracting result of signal vias 9A connected to the wiring patterns Nos. 10, 15, 25, 64 and 52, respectively. It is noted that, in the example of FIG. 14A, the determination criterion of the characteristic impedance is determined as 25Ω, and, in this case, wiring patterns having characteristic impedances equal to or more than the determination criterion are the three wiring patterns 6 of Nos. 10, 15 and 25.

FIG. 14B depicts the extracting result of GND via 9B nearest to the three wiring patterns of Nos. 10, 15 and 25.

The management part 220 stores the data indicating the grading result and the extracting result depicted in FIGS. 14A and 14B in the HDD 24.

Figure 15:
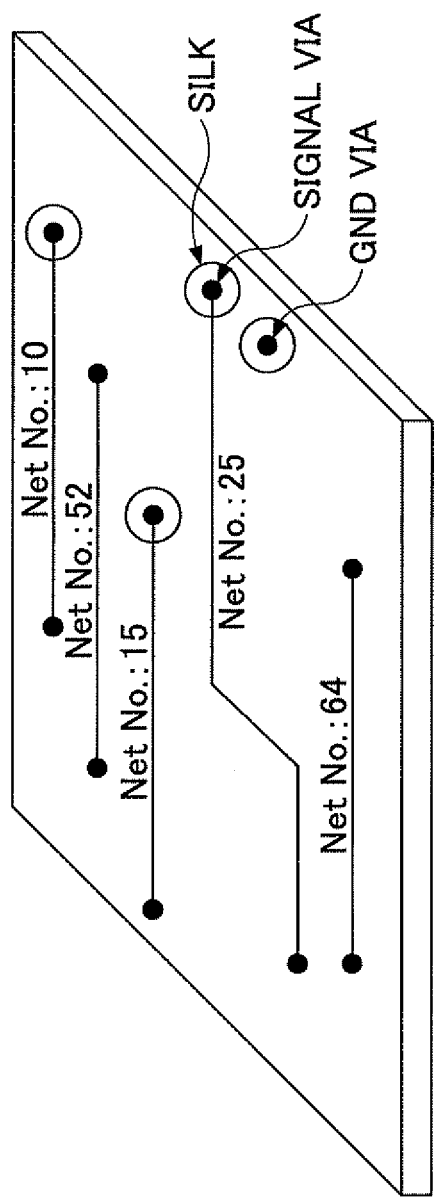
FIG. 15 depicts a state in which marks made by silk-screen printing are provided for signal vias 9A connected to wiring patterns 6 of No. 3, No. 1 and No. 5 determined as having high characteristic impendence degradation degrees in the printed circuit board test assisting apparatus in the embodiment 1, and a nearest GND via 9B.

FIG. 15 depicts a state in which marks made by silk-screen printing are provided (as indicated by "silk" in FIG. 15) for the signal vias 9A respectively connected to the wiring patterns 6 of Nos. 10, 15 and 25 which are determined as having characteristic impedance degradation degrees in higher ranks, and the nearest GND via 9B, by the printed circuit board test assisting apparatus in the embodiment 1. The nearest GND via 9B is located nearest to the signal vias 9A connected to the wiring patterns 6 of Nos. 10, 15 and 25 determined as having characteristic impedance degradation degrees in higher ranks. The nearest GND via 9B is extracted based on the position data depicted in FIGS. 5A and 5C, by the via extracting part 218 of the CPU 21.

By thus providing marks made by silk-screen printing for the wiring patterns 6 for which it is determined by the extracting process part 216 from the data indicating the grading result provided by the grading process part 217 as having the characteristic impedance degradation degrees equal to or more than the determination criterion, it is possible to easily identify the wiring patterns 6 having the large characteristic impedance degradation degrees when an actual measurement test is carried out on the printed circuit board 5 after manufacturing thereof.

Thus, by the printed circuit board test assisting apparatus in the embodiment 1, areas of solid pattern removed areas 8 are calculated by using CAD data, and characteristic impedance degradation degrees are calculated. As a result, it is possible to identify wiring patterns 6 having large characteristic impedance degradation degrees, from among wiring patterns having high levels of importance included in a huge number of wiring patterns 6, by selecting wiring patterns 6 which transmit signals having high levels of importance or such. The wiring patterns 6 having the high levels of importance can be selected by using the attributes of the wiring patterns 6 (for example, signal names). Therefore, calculation may not be carried out for all the wiring patterns 6, and thus, it is possible to reduce the number of processes. Further, it is possible to calculate characteristic impedance degradation degrees in consideration of very small solid pattern removed areas (pattern removed areas) or such. Therefore, it is possible to extract wiring patterns having large influence on signal characteristics in consideration of very small pattern removed areas or such, for the purpose of being used in an actual measurement test carried out after manufacturing a printed circuit board.

Further, by providing marks made by silk-screen printing for wiring patterns 6 having large characteristic impedance degradation degrees, it is possible to carry out an actual measurement test for wiring patterns 6 having large characteristic impedance degradation degrees selectively after manufacturing a printed circuit board 5. Therefore, it is possible to positively carry out an actual measurement test on wiring patterns 6 having large characteristic impedance degradation degrees, and it is possible to carry out assisting so that the actual measurement test can be efficiently carried out.

It is noted that, as described below, it is possible to partially modify the process/operation contents carried out by the printed circuit board test assisting apparatus in the embodiment 1 described above.

Figure 16A:
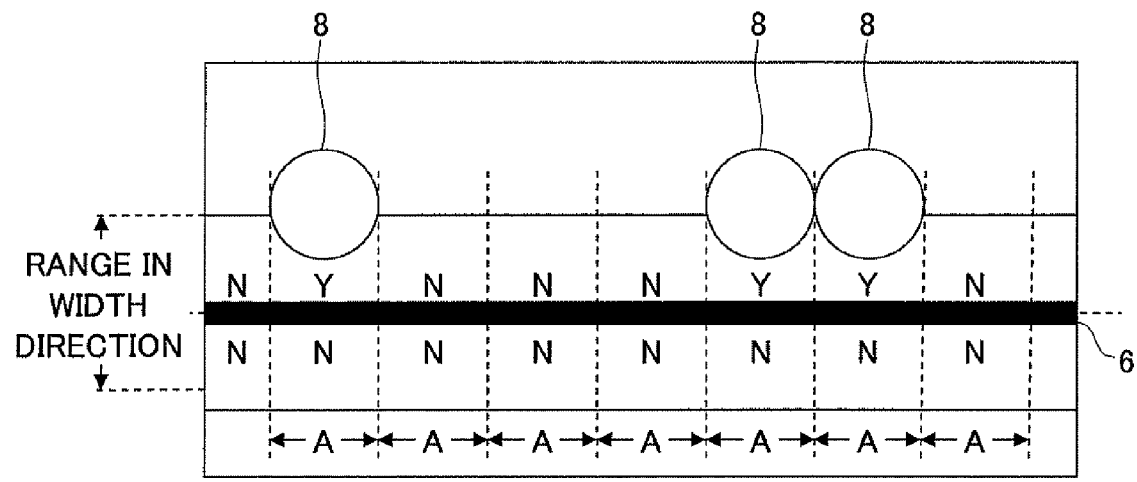
FIGS. 16A and 16B illustrate another method of calculating an area of a solid pattern removed area 8 in the printed circuit board test assisting apparatus in the embodiment 1.
Figure 16B:
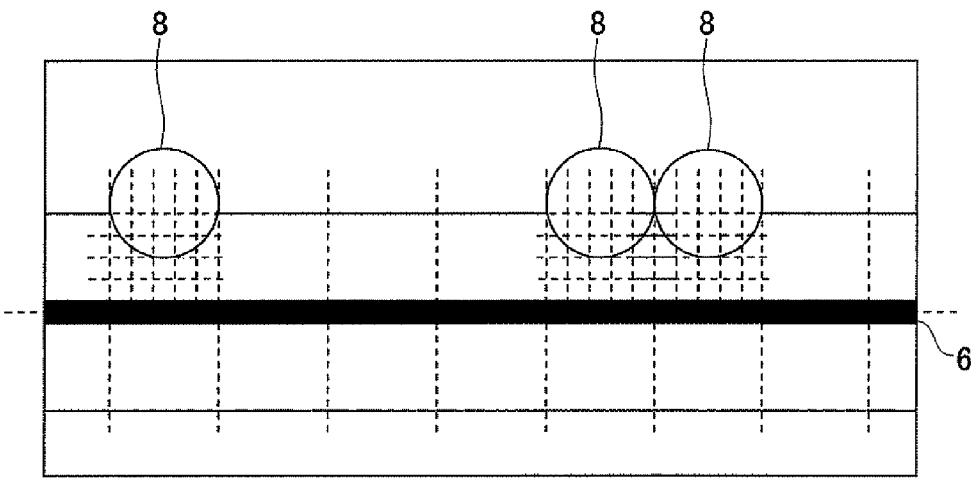

FIGS. 16A, 16B illustrate another method of calculating an area of a solid pattern removed area 8 in the printed circuit board test assisting apparatus in the embodiment 1.

In the above description, the solid pattern removed area 8 existing within the range in the width direction is divided into meshes from the start point to the end point of the wiring pattern 6, and the characteristic impedance degradation degree is obtained for each unit area (mesh). However, as depicted in FIG. 16A, before being divided into meshes, the wiring pattern 6 may be divided into plural sections each having a predetermined length A. Then, after it is determined whether each section of the plural sections includes the solid pattern removed area 8, dividing into meshes may be carried out as depicted in FIG. 16B only for the section for which the solid pattern removed area 8 exists ("Y"), and a characteristic impedance degradation degree may be calculated for each unit area (mesh).

Further, degradation in a characteristic impedance appears also as a distortion in a waveform (TDR waveform) measured by a TDR (time-domain reflectometer) for example. However, a waveform measured by the TDR includes an influence caused by all factors from a start point to an end point of a wiring pattern 6. Therefore, it is not possible to extract and determine an influence of a solid pattern removed area 8 that exists at a position.

In the printed circuit board test assisting apparatus in the embodiment 1, it is possible to calculate an influence of a solid pattern removed area 8 on a TDR waveform by using an area and a position of the solid pattern removed area 8 included in the CAD data.

Figure 17A:
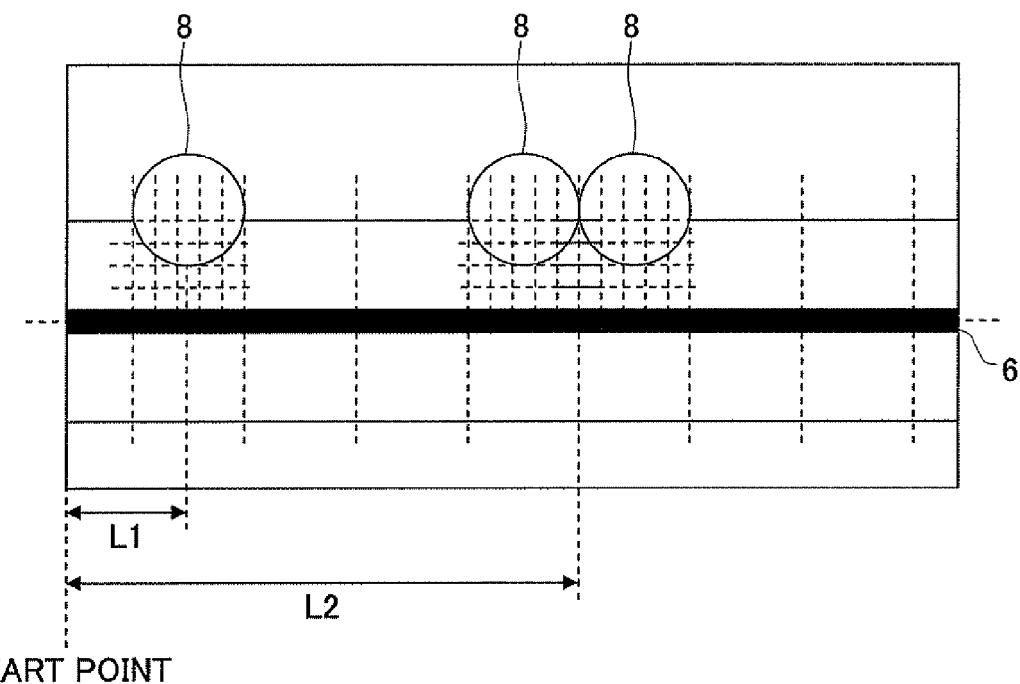
FIGS. 17A and 17B illustrate a method of calculating a signal propagation time from a measurement point and a solid pattern removed area 8 in the printed circuit board test assisting apparatus in the embodiment 1.
Figure 17B:
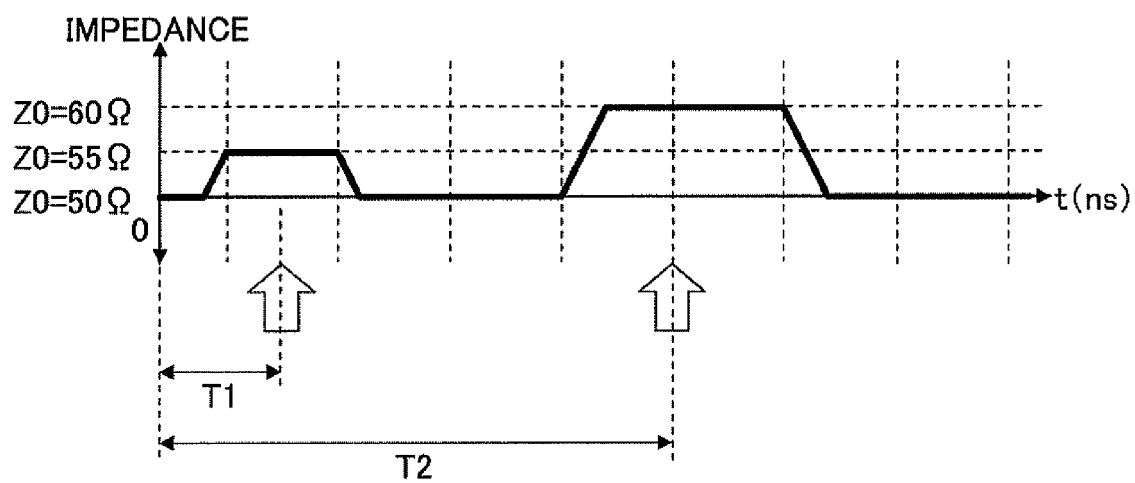

FIGS. 17A and 17B illustrate a method of calculating a propagation time of a signal from a measurement point to solid pattern removed areas 8 in the printed circuit board test assisting apparatus in the embodiment 1. FIG. 17A roughly depicts a relationship between a wiring pattern 6 and solid pattern removed areas 8. FIG. 17B roughly depicts on a TDR waveform a round-trip propagation time of a signal between a start point depicted in FIG. 17A and the solid pattern removed areas 8. It is noted that, in FIG. 17B, for the sake of convenience in explanation, values of characteristic impedance are indicated on an ordinate axis that indicates a magnitude of the TDR waveform.

As depicted in FIG. 17A, L1 denotes a distance from the start point to the center of the first solid pattern removed area 8 along the wiring pattern 6, and L2 denotes a distance from the start point to the middle point of the second and third solid pattern removed areas 8 along the wiring pattern 6.

It is assumed that a propagation time of a signal for a unit length in the wiring pattern 6 of the printed circuit board 5 is τ. Then, a round-trip propagation time T between the start point for measuring the waveform by the TDR and the solid pattern removed area 8 can be expressed by the following formula (3):

$$T = L/\tau \times 2 \quad (3)$$

This indicates a propagation time for a signal propagating through the wiring pattern 6 from the start point on the wiring pattern for measuring the TDR waveform, being reflected by the solid pattern removed area 8, and then returning to the start point.

By substituting the distances L1 and L2 into the formula (3), respective round-trip propagation times T1 and T2 are obtained as $T1 = L1/\tau \times 2$ (ns), and $T2 = L2/\tau \times 2$ (ns).

The calculation of the round-trip propagation times may be carried out by the CPU 21 using the CAD data, and the process result display part 219 may display a calculation result on the display screen 12A of the display 12.

As depicted in FIG. 17B, as a designer obtains the round-trip propagation times T1 and T2 from an oscilloscope that displays the TDR waveform, the designer can understand a distortion in the TDR waveform caused by the specific solid pattern removed areas 8. Therefore, the designer can easily understand an influence of the solid pattern removed areas 8 on the TDR waveform, when carrying out an actual measurement test after a printed circuit board 5 is manufactured.

Embodiment 2

In the embodiment 1 described above, a degradation degree in signal characteristics is calculated as a result of a characteristic impedance degradation degree being calculated. A printed circuit board test assisting apparatus in an embodiment 2 is different from the embodiment 1 in that, when a degradation degree in signal characteristics is calculated, a degradation degree in signal characteristics caused by crosstalk is calculated.

As depicted in FIG. 4 for describing the embodiment 1, in a case where the wiring patterns 6 and the solid pattern removed areas 8A and 8B are close together, when the wiring patterns 6, existing on the dielectric layer 5e that is one layer below the dielectric layer 5d in which the solid pattern removed areas 8A and 8B are formed, is near to the solid pattern removed areas 8A and 8B, crosstalk may occur between wiring patterns via the solid pattern removed areas 8A and 8B. Crosstalk causes a degradation in signal characteristics.

Figure 18:
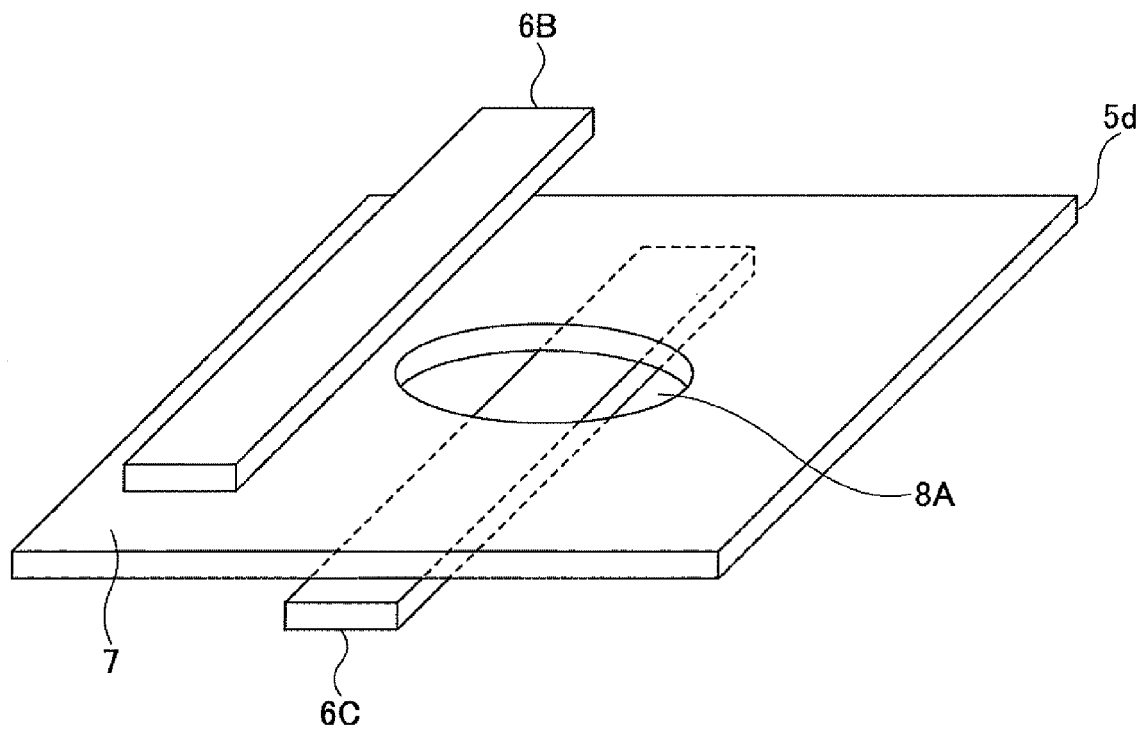
FIG. 18 depicts a perspective view of one example of positional relationships between wiring patterns 6B, 6C and the solid pattern removed area 8A.

FIG. 18 is a perspective view depicting one example of a positional relationship between wiring patterns 6B and 6C and a solid pattern removed area 8A. The wiring pattern 6B is formed on a third dielectric layer 5c, the solid pattern removed area 8A is formed as an opening in a solid pattern 7 formed on a fourth dielectric layer 5d, and the wiring pattern 6C is formed on a fifth dielectric layer 5e. However, for the sake of convenience in explanation, the dielectric layers 5c through 5e are omitted in FIG. 18.

Further, although actually a signal via or a GND via is formed through the solid pattern removed area 8A, such a signal via or a GND via is omitted in FIG. 18 for the sake of convenience in explanation.

Figure 19:
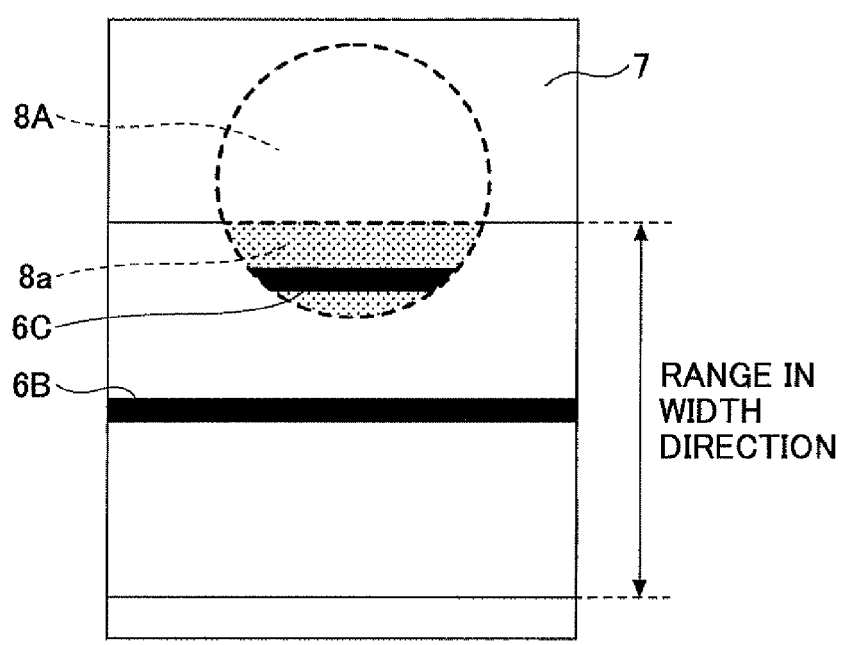
FIG. 19 depicts the positional relationships between the wiring patterns 6B, 6C and the solid pattern removed area 8A depicted in FIG. 18 in a plan view manner.

FIG. 19 depicts positional relationships between the wiring patterns 6B, 6C and the solid pattern removed area 8A depicted in FIG. 18 in the plan view manner. In a case of the positional relationships depicted in FIG. 18, the wiring pattern 6C is located immediately below the solid pattern removed area 8A in the plan view manner as depicted in FIG. 19.

In the printed circuit board test assisting apparatus in the embodiment 2, an area of a crosstalk area is calculated, the calculated area is multiplied by a coefficient for obtaining noise caused by crosstalk, and thus a wiring pattern to be used in an actual measurement test is extracted.

The crosstalk area means an area by which the wiring pattern 6C overlaps an area 8a of the solid pattern removed area 8A in a plan view manner, which area 8a (filled with halftone dots) exists within a range in a width direction of the wiring pattern 6B. That is, the crosstalk area means an area by which, within the range in the width direction of the wiring pattern 6B, the solid pattern removed area 8B overlaps the wiring pattern 6C. In the case of FIG. 19, an area of the part of the wiring pattern 6C which part can be seen through the solid pattern removed area 8A as depicted in FIG. 19 is the crosstalk area.

Figure 20:
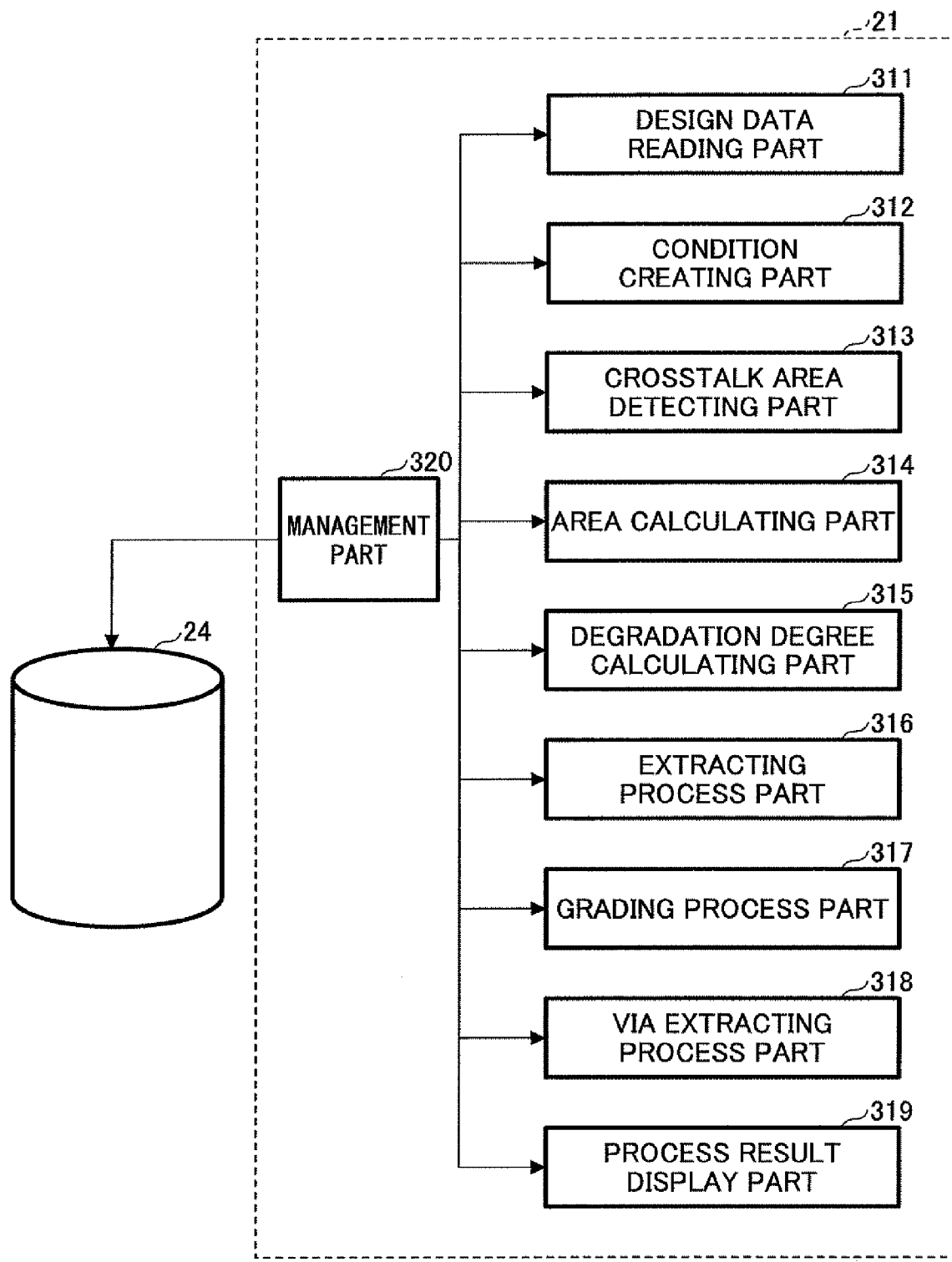
FIG. 20 depicts a block diagram of functions of a printed circuit board test assisting apparatus in an embodiment 2.

FIG. 20 is a block diagram depicting functions of the printed circuit board test assisting apparatus in the embodiment 2. The functional block of FIG. 20 is realized as a result of the CPU 21 depicted in FIG. 2 executing a printed circuit board test assisting program stored in the HDD 24.

The functional block realized by the CPU 21 includes a design data reading part 311, a condition creating part 312, a crosstalk area detecting part 313, an area calculating part 314, a degradation degree calculating part 315, an extracting process part 316, a grading process part 317, a via extracting process part 318, a process result display part 319 and a management part 320. Below, mainly points in the embodiment 2 different from the embodiment 1 will be described.

The design data reading part 311 carries out the same process as the process the design data reading part 211 in the embodiment 1 carries out.

The condition creating part 312 creates conditions used for calculating a degradation degree in signal characteristics caused by crosstalk described later, based on conditions input via the keyboard 13 or the mouse 14. As the conditions thus input, for example signal types of signals transmitted by wiring patterns 6, a range in a width direction used for calculating the degradation degree in signal characteristics caused by crosstalk, a length of a side of a mesh used for calculating an area of a crosstalk area, an extracting condition used for extracting wiring patterns 6 (for example, a value indicating intensity of crosstalk), a threshold of intensity of crosstalk used for extracting for grading, or such, may be cited.

The crosstalk area detecting part 313 classifies positional relationships between a solid pattern removed area 8 with respect to a wiring pattern 6 in the plan view manner and another wiring pattern 6 that is seen through the solid pattern removed area 8 in the plan view manner, based on X coordinates and Y coordinates of the wiring patterns 6 depicted in FIG. 5A and an X coordinate and a Y coordinate of the solid pattern removed area 8 depicted in FIG. 5B.

The area calculating part 314 extracts wiring patterns 6 for which calculation is carried out according to signal types (signal names) of signals transmitted by the wiring patterns 6 created by the condition creating part 312, and calculates an area of a crosstalk area existing within the range in the width direction used for calculating intensity of crosstalk. As described above, the crosstalk area means an area by which, within the range in the width direction of the wiring pattern 6, the solid pattern removed area 8 and the other wiring pattern 6 overlap together. Therefore, a degradation degree in signal characteristics in the printed circuit board test assisting apparatus in the embodiment 2 is calculated by using an area of the solid pattern removed area 8.

The degradation degree calculating part 315 calculates intensity of crosstalk as a degradation degree in signal characteristics in the wiring pattern 6 for which calculation is carried out, by using the positional relationships between the wiring pattern 6, the solid pattern removed area 8 and the other wiring pattern, classified by the crosstalk area detecting part 313, and the area of the crosstalk area calculated by the area calculating part 314.

The extracting process part 316 extracts wiring patterns 6 having crosstalk intensity (intensity of crosstalk) equal to or more than predetermined intensity to be used for an actual measurement test, from among plural wiring patterns 6 for which crosstalk intensity is obtained by the degradation degree calculating part 315.

The grading process part 317 grades the wiring patterns 6 extracted by the extracting process part 316 according to crosstalk intensity.

The via extracting process part 318 extracts signal vias 9A connected to the wiring patterns graded by the grading process part 317 and GND vias 9B nearest to the signal vias 9A. By thus extracting the signal vias 9A and the GND vias 9B, positions of the signal vias 9A and positions of the GND vias 9B are extracted. The signal vias 9A connected to the wiring patterns 6 graded by the grading process part 317 are identified as a result of the signal vias 9A having the same signal names as those of the wiring patterns 6 being extracted from the fourth database depicted in FIG. 5C. The nearest GND vias 9B are identified as a result of the GND vias 9B nearest to the positions of the extracted signal vias 9A being extracted from the fourth database depicted in FIG. 5C.

The process result display part 319 displays, on the display screen 12A of the display 12 depicted in FIG. 1, the numbers of the wiring patterns 6 graded by the grading process part 317, and the positions of the signal vias 9A and the GND vias 9B extracted by the via extracting process part 318.

The management part 320 manages storing of data in the HDD 24.

FIG. 21 is a table depicting noise per unit area ("noise per unit area (mV)") for calculating crosstalk intensity per unit area of a crosstalk area in the printed circuit board test assisting apparatus in the embodiment 2.

The table depicting noise for calculating crosstalk intensity of FIG. 21 is used for calculating crosstalk intensity as an index for measuring a degradation degree in signal characteristics, and indicates noise per unit area ("noise per unit area (mV)") for calculating crosstalk intensity per unit area of a crosstalk area with respect to a dielectric constant of dielectric layers ("dielectric constant") and a distance between wiring patterns in a thickness direction. The table depicted in FIG. 21 and a table depicted in FIG. 22 (described later) are one example of degradation degree information indicating a degradation degree in signal characteristics in a wiring pattern 6 with respect to positional relationships of wiring patterns 6 and a solid pattern removed area 8, and a size of the solid pattern removed area 8, and, are stored in the HDD 24 as a third database.

FIG. 22 depicts a table of correction coefficients to be used for calculating crosstalk intensity in the printed circuit board test assisting apparatus in the embodiment 2. As depicted in FIG. 22, a specific value of the correction coefficient is determined according to a distance between wiring patterns 6 and a distance between a wiring pattern 6 and a solid pattern removed area 8 ("solid offset (mm)" in FIG. 22).

The distance between wiring patterns 6 in FIG. 22 means a distance between the wiring patterns 6 in a plan view manner, and, for example, a distance between the wiring patterns 6B and 6C depicted in FIG. 19. The distance between a wiring pattern 6 and a solid pattern removed area 8 ("solid offset") means, for example, in a case where the wiring pattern 6B depicted in FIG. 19 is offset (or shifted) from the solid pattern removed area 8A, a distance (offset amount) between the wiring pattern 6B and the solid pattern removed area 8A.

Figure 23:
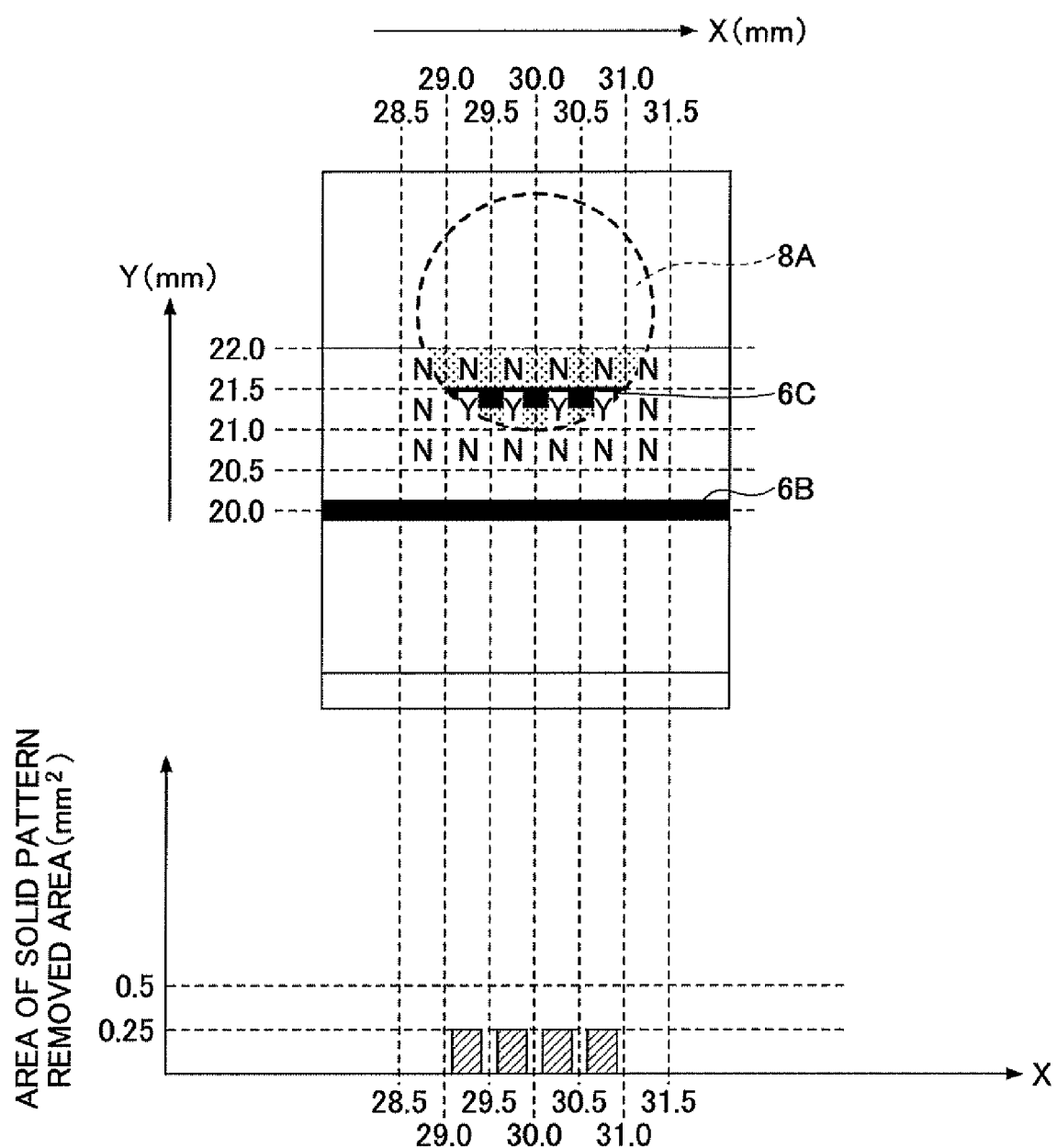
FIG. 23 illustrates a method of calculating an area of a crosstalk area used in calculating intensity of crosstalk in the printed circuit board test assisting apparatus in the embodiment 2.

FIG. 23 illustrates a method of calculating an area of a crosstalk area used for calculating crosstalk intensity in the printed circuit board test assisting apparatus in the embodiment 2.

The area calculating part 314 calculates an area of a crosstalk area as follows: A range for which calculation is carried out is divided into square meshes each having a predetermined area, from a start point to an end point of a wiring pattern 6 for which calculation of a degradation degree in signal characteristics is carried out, and it is determined, for each mesh, whether a solid pattern removed area 8 and a wiring pattern 6 exist.

When a solid pattern removed area 8 and a wiring pattern 6 simultaneously exist at least in a part of a mesh, the mesh is determined as having a crosstalk area. That is, a mesh determined as not having a crosstalk area is a mesh in which a solid pattern removed area 8 and a wiring pattern 6 do not simultaneously exist.

A length of a side of the mesh is determined, for example, by the following formula (4):

(a length of a side of the mesh)=(rise time)×(propagation velocity in transmission path)/(any dividing number)  (4)

It is assumed that a length of a side of the mesh is 0.5 mm. Further, as a coordinate of the mesh, the smallest one in a numeric value from among the coordinates of the four corners of the (square) mesh is used. That is, in the example of FIG. 23, the coordinate value of the bottom left vertex is used to identify the mesh.

In the example of FIG. 23, it is determined, for meshes included in a range of X=28.5 through 31.5 and also, a range of Y=20.0 through 22.0, whether they have a crosstalk area. It is noted that, in FIG. 23, "Y" denotes a mesh determined as having a crosstalk area, and "N" denotes a mesh determined as not having a crosstalk area.

In the example of FIG. 23, as depicted in FIG. 19, the part of the wiring pattern 6C which part is seen through the solid pattern removed area 8A is the crosstalk area. Therefore, as a calculation result, the following areas are obtained: 0 mm$^2$ for a section of X=28.5 through 29.0, 0.25 mm$^2$ for a section of X=29.0 through 29.5, 0.25 mm$^2$ for a section of X=29.5 through 30.0, 0.25 mm$^2$ for a section of X=30.0 through 30.5, 0.25 mm$^2$ for a section of X=30.5 through 31.0, 0 mm$^2$ for a section of X=31.0 through 31.5.

FIG. 24 depicts, in a table form, a result of extracting a distance between wiring patterns together with the determination result of FIG. 23. The distance between wiring patterns 6 in FIG. 24 means a distance between the wiring patterns 6 in a plan view manner, and, for example, a distance between the wiring patterns 6B and 6C depicted in FIG. 19.

As depicted in FIG. 24, for the mesh determined as having a crosstalk area ("Y"), a flag "1" is given, while for the mesh determined as not having a crosstalk area ("N"), a flag "0" is given. The flag is used by the degradation degree calculating part 315 to calculate crosstalk intensity.

The degradation degree calculating part 315 selects a noise amount per unit area ("noise per unit area (mV)") from the table of FIG. 21 by using a dielectric constant of dielectric layers (corresponding to "dielectric constant" in FIG. 21) and a distance between wiring patterns in a thickness direction (corresponding to "distance between wiring patterns in thickness direction (mm)" in FIG. 21) included in the CAD data, and also, selects a correction coefficient from the table of FIG. 22 by using position data included in the CAD data and a result of extracting a distance between wiring patterns for which calculation is carried out (corresponding to "distance between wiring patterns (mm)" in FIG. 22) depicted in FIG. 24, and calculates crosstalk intensity per unit area by using the following formula (5):

(crosstalk intensity)=(noise amount per unit area)×(correction coefficient)  (5)

The above-mentioned dielectric constant of dielectric layers ("dielectric constant" depicted in the table of FIG. 21) means a dielectric constant of dielectric layers included in a printed circuit board 5 existing between wiring patterns for which calculation is carried out. The distance between wiring patterns in a thickness direction means a distance between wiring patterns for which calculation is carried out in a thickness direction. The thickness direction is a direction perpendicular to a surface of the dielectric layer on which the wiring pattern is formed. In the example of FIG. 18, the dielectric constant of dielectric layers is a dielectric constant of the dielectric layers 5c and 5d existing between the wiring patterns 6B and 6C for which calculation is carried out. The distance between wiring patterns in the thickness direction is a distance between the wiring patterns 6B and 6C in the thickness direction.

Further, in the selecting of the correction coefficient from the table of FIG. 22, the position data of the CAD data that includes data such as that depicted in FIGS. 5A and 5B, for example, is used, and by using the data, the "solid offset" depicted in FIG. 22 is obtained. By using the thus-obtained solid offset, together with the extracted distance between the wiring patterns for which calculation is carried out depicted in FIG. 24, the correction coefficient is extracted from the table of FIG. 22.

The formula (5) is a formula for obtaining crosstalk intensity per unit area of a crosstalk area in consideration of a first factor concerning positional relationships in the thickness direction and a second factor concerning positional relationships obtained in the plan view manner. The table of FIG. 21 provides noise per unit area for calculating crosstalk intensity per unit area of a crosstalk area in consideration of the first factor. The table of FIG. 22 provides a correction coefficient used in the formula (5) to correct, according to the second factor, the noise per unit area obtained in consideration of the first factor obtained from the table of FIG. 21, to obtain crosstalk intensity per unit area of a crosstalk area in consideration of both the first factor and the second factor.

The crosstalk intensity per unit area thus obtained by using the formula (5) by the degradation degree calculating part 315 is integrated from the start point to the end point of the wiring pattern 6, in the same way as that for the characteristic impedance in the embodiment 1, and thus, for each wiring pattern 6, crosstalk intensity is calculated.

The extracting process part 316 determines whether the crosstalk intensity of each wiring pattern is equal to or more than the predetermined intensity, and extracts a wiring pattern 6 having the crosstalk intensity equal to or more than the predetermined intensity to be used in an actual measurement test.

After that, in the same way as that in the embodiment 1, the grading process part 317 grades the wiring patterns 6, the via extracting part 318 extracts signal vias 9A and nearest GND vias 9B, and the process result display part 319 displays the grading result and the extracting result.

Thus, by the printed circuit board test assisting apparatus in the embodiment 2, a crosstalk area is calculated by using CAD data, and crosstalk intensity is calculated. As a result, it is possible to identify wiring patterns 6 having a large amount of crosstalk, from among wiring patterns having high levels of importance included in a huge number of wiring patterns 6, by selecting wiring patterns 6 which transmit signals having high levels of importance or such. The wiring patterns 6 having the high levels of importance can be selected by using the attributes of the wiring patterns 6 (for example, signal names of signals transmitted by the wiring patterns 6). Therefore, calculation may not be carried out for all the wiring patterns 6, and thus, it is possible to reduce the number of processes.

Further, by providing marks made by silk-screen printing for wiring patterns 6 having large crosstalk intensity, it is possible to carry out an actual measurement test for wiring patterns 6 having large crosstalk intensity selectively after manufacturing a printed circuit board 5. Therefore, it is possible to positively carry out an actual measurement test on wiring patterns 6 having large crosstalk intensity, and it is possible to carry out assisting so that the actual measurement test can be efficiently carried out.

Further, it is possible to calculate crosstalk intensity in consideration of very small solid pattern removed areas (pattern removed areas) or such. Therefore, it is possible to extract wiring patterns having large influence on signal characteristics in consideration of very small pattern removed areas or such, for the purpose of being used in an actual measurement test carried out after manufacturing a printed circuit board that uses high-speed (high data transfer rate) signals.

It is noted that it is possible to combine the printed circuit board test assisting apparatus in the embodiment 1 and the printed circuit board test assisting apparatus in the embodiment 2 together. That is, wiring patterns 6 to be used in an actual measurement test may be extracted in consideration of both characteristic impedance degradation and influence of crosstalk.

Embodiment 3

According to the printed circuit board test assisting apparatus in the embodiment 1 described above, the degradation degree calculating part 215 obtains a specific value of characteristic impedance. A printed circuit board test assisting apparatus in an embodiment 3 is different from the above-described printed circuit board test assisting apparatus in the embodiment 1 in that the degradation degree calculating part 215 determines a degradation degree in signal characteristics by using an area of a solid pattern removed area 8 existing from a start point to an end point of a wiring pattern 6. That is, according to the printed circuit board test assisting apparatus in the embodiment 3, as a value representing a characteristic impedance degradation degree, an area of a solid pattern removed area 8 is used. The other configuration of the embodiment 3 is the same as that of the printed circuit board test assisting apparatus in the embodiment 1, the same reference numerals are given to the same parts/components, and description thereof will be omitted. Further, FIG. 6 used above for describing the functions of the printed circuit board test assisting apparatus in the embodiment 1 is also used to describe functions the printed circuit board test assisting apparatus in the embodiment 3.

The degradation degree calculating part 215 in the embodiment 3 integrates the areas of the solid pattern removed area 8, calculated by the area calculating part 214, from the start point to the end point of the wiring pattern 6, and thus, obtains the area of the solid pattern removed area 8 existing from the start point to the end point of the wiring pattern 6 within the range in the width direction for which a characteristic impedance degradation degree is calculated. The degradation degree calculating part 215 in the embodiment 3 does not use the "increased coefficient" depicted in FIG. 8, which is used in the above-mentioned formula (2), and the "solid pattern removed area ($mm^2$) for the section" in the formula (2) is integrated from the start point to the end point of the wiring pattern 6, and determines a characteristic impedance degradation degree by using the value obtained from thus integrating the area (referred to as an integrated area value, or an area value of a solid pattern removed area, hereinafter).

The extracting process part 216 in the embodiment 3 extracts wiring patterns having the integrated area value equal to or more than a criterion value, from among the plural wiring patterns 6 for which the degradation degree calculating part 215 has thus obtained the areas of solid pattern removed areas 8.

The grading process part 217 in the embodiment 3 grades the wiring patterns 6 according to thus-obtained area values of solid pattern removed areas 8, and creates data in which the wiring patterns 6 are sorted in descending order according to the area values of solid pattern removed areas 8.

FIGS. 25A and 25B depict a grading result and an extracting result obtained by the printed circuit board test assisting apparatus in the embodiment 3. The grading result and the extracting result depict the grading result provided by the grading process part 217 and the extracting result provided by the via extracting process part 218, together in FIGS. 25A and 25B.

FIG. 25A depicts the grading result from the first through the fifth places of wiring patterns 6 of Nos. 10, 15, 25, 64 and 52, and an extracting result of signal vias 9A connected to the wiring patterns Nos. 10, 15, 25, 64 and 52, respectively. It is noted that, in the example of FIG. 25A, the determination criterion for the areas of solid pattern removed areas 8 is determined as 2.5 mm$^2$, and, in this case, the wiring patterns having the areas of solid pattern removed areas 8 equal to or more than the determination criterion are the three wiring patterns 6 of Nos. 10, 15 and 25.

FIG. 25B depicts the extracting result of GND vias 9B nearest to the three wiring patterns of Nos. 10, 15 and 25.

The management part 220 stores the data indicating the grading result and the extracting result depicted in FIGS. 25A and 25B in the HDD 24.

The grading result thus stored in the HDD 24 may be used to provide marks made by silk screen printing to a printed circuit board 5. Thereby, in the same way as in the embodiment 1, it is possible to easily select wiring patterns 6 having large characteristic impedance degradation degrees when an actual measurement test is carried out after a printed circuit board 5 is manufactured.

Thus, by the printed circuit board test assisting apparatus in the embodiment 3, in the same way as in the embodiment 1, areas of solid pattern removed areas 8 are calculated by using CAD data, and characteristic impedance degradation degrees are calculated based on the areas of the solid pattern removed areas 8. As a result, it is possible to identify wiring patterns 6 having large characteristic impedance degradation degrees, from among wiring patterns having high levels of importance included in a huge number of wiring patterns 6, by selecting wiring patterns 6 which transmit signals having high levels of importance or such. The wiring patterns 6 having the high levels of importance can be selected by using the attributes of the wiring patterns 6 (for example, signal names). Therefore, calculation may not be carried out for all the wiring patterns 6, and thus, it is possible to reduce the number of processes. Further, it is possible to calculate characteristic impedance degradation degrees in consideration of very small solid pattern removed areas (pattern removed areas) or such. Therefore, it is possible to extract wiring patterns having large influence on signal characteristics in consideration of very small pattern removed areas or such, for the purpose of being used in an actual measurement test carried out after manufacturing a printed circuit board.

Further, by providing marks made by silk-screen printing for wiring patterns 6 having large characteristic impedance degradation degrees, it is possible to carry out an actual measurement test for wiring patterns 6 having large characteristic impedance degradation degrees selectively after manufacturing a printed circuit board 5. Therefore, it is possible to positively carry out an actual measurement test on wiring patterns 6 having large characteristic impedance degradation degrees, and it is possible to carry out assisting so that the actual measurement test can be efficiently carried out.

It is noted that, in the embodiment 3, instead of a shift of characteristic impedance being calculated in the embodiment 1, areas of solid pattern removed areas which cause degradation in signal characteristics are obtained, whereby wiring patterns to be used in an actual measurement test are extracted.

However, to thus extract wiring patterns for an actual measurement test by using areas of areas causing degradation in signal characteristics may also be applied to the embodiment 2. In a case of applying in the embodiment 2, wiring patterns to be used in an actual measurement test may be extracted based on the calculated results of the areas of the crosstalk areas.

Thus, by the printed circuit board test assisting apparatus in the embodiment 3, in the same way as in the embodiments 1 and 2, areas of solid pattern removed areas 8 or areas of crosstalk areas which cause degradation in signal characteristics are calculated by using CAD data, and degradation degrees in signal characteristics are calculated based on the areas of the solid pattern removed areas 8 or the areas of the crosstalk areas. As a result, it is possible to identify wiring patterns 6 having large degradation degrees in signal characteristics, from among wiring patterns having high levels of importance included in a huge number of wiring patterns 6, by selecting wiring patterns 6 which transmit signals having high levels of importance or such. The wiring patterns 6 having the high levels of importance can be selected by using the attributes of the wiring patterns 6 (for example, signal names). Therefore, calculation may not be carried out for all the wiring patterns 6, and thus, it is possible to reduce the number of processes. Further, it is possible to calculate degradation degrees in signal characteristics in consideration of very small solid pattern removed areas (pattern removed areas) or such. Therefore, it is possible to extract wiring patterns having large influence on signal characteristics in consideration of very small pattern removed areas or such, for the purpose of using in an actual measurement test carried out after manufacturing a printed circuit board.

Further, by providing marks made by silk-screen printing for wiring patterns 6 having large degradation degrees in signal characteristics, it is possible to carry out an actual measurement test for wiring patterns 6 having large degradation degrees in signal characteristics selectively after manufacturing a printed circuit board 5. Therefore, it is possible to positively carry out an actual measurement test on wiring patterns 6 having large degradation degrees in signal characteristics, and it is possible to carry out assisting so that the actual measurement test can be efficiently carried out.

Thus, in the embodiments of the present invention, it is possible to provide a printed circuit board test assisting apparatus, a printed circuit board test assisting method and a computer-readable information recording medium for efficiently assisting in an actual measuring test to be carried out after manufacturing a high-density mounting printed circuit board.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present inventions have been described in detail, it should be understood that various changes, substitutions, and alterations could be made hereto without departing from the spirit and scope of the invention.

What is claimed is:

1. An apparatus that assists a test of wiring patterns that are formed on a printed circuit board, the apparatus comprising:
a first database that stores attribute information and position information that indicate attributes and positions of the wiring patterns in a manner in which the attribute information and the position information are associated with the wiring patterns;
a second database that stores position information and size information that indicate positions and sizes of pattern removed areas that exist in solid patterns provided in the printed circuit board;
a third database that stores degradation degree information that indicates degradation degrees in signal characteristics in the wiring patterns with respect to positional relationships between the wiring patterns and the pattern removed areas, and sizes of the pattern removed areas;
an input unit that has attribute information of a wiring pattern input thereto;
a degradation degree process unit that obtains a degradation degree in the signal characteristics in the wiring pattern corresponding to the attribute information that is input to the input unit, based on the position information of the wiring pattern corresponding to the attribute information input to the input unit, position information and size information of the pattern removed area, and the degradation degree information; and
a first extracting unit that extracts, for an actual measurement test, the wiring pattern that has the degradation degree equal to or more than a predetermined degree, from the wiring patterns for which degradation degrees have been obtained by the degradation degree process unit,
wherein the degradation degree process unit divides the pattern removed areas in predetermined area units in order to obtain the degradation degree in signal characteristics of the wiring pattern for each of the predetermined area units of the pattern removed areas, and
wherein each of the predetermined area units has a side that is determined based on a fall or rise time of a signal transmitted through the wiring pattern and a propagation velocity of the signal in the wiring pattern.

2. The apparatus as claimed in claim 1, further comprising:
a fourth database that stores position information that indicates positions on an obverse side or a reverse side of the printed circuit board of signal vias that are connected to the wiring patterns; and
a second extracting unit that extracts, from the fourth database, position information of the signal via that is connected to the wiring pattern that is extracted by the first extracting unit.

3. The apparatus as claimed in claim 1, wherein the degradation degree process unit obtains the degradation degree in signal characteristics in the wiring pattern by using, in a plan view manner, area data of the pattern removed area that is located within a predetermined range in a width direction with respect to the wiring pattern.

4. The apparatus as claimed in claim 1, further comprising:
a grading unit that grades the wiring patterns according to the degradation degrees in signal characteristics.

5. The apparatus as claimed in claim 1, wherein the degradation degree in signal characteristics in the wiring pattern includes a degradation degree in signal characteristics caused by a change in characteristic impedance of the wiring pattern or crosstalk occurring in the wiring pattern.

6. A method for assisting, by a computer, a test of wiring patterns that are formed on a printed circuit board, the method comprising:
accessing, by the computer, a first database that stores attribute information and position information that indicate attributes and positions of the wiring patterns in a manner in which the attribute information and the position information are associated with the wiring pasterns, a second database that stores position information and size information that indicate positions and sizes of pattern removed areas that exist in solid patterns provided in the printed circuit board, and a third database that stores degradation degree information that indicates degradation degrees in signal characteristics in the wiring patterns with respect to positional relationships between the wiring patterns and the pattern removed areas, and sizes of the pattern removed areas;
obtaining, by the computer, a degradation degree in the signal characteristics in the wiring pattern corresponding to the attribute information that is input to an input unit, based on position information of the wiring pattern corresponding to the attribute information input to the input unit, position information and size information of the pattern removed area, and the degradation degree information; and
extracting, by the computer, for an actual measurement test, the wiring pattern that has the degradation degree equal to or more than a predetermined degree, from the wiring patterns for which degradation degrees have been obtained by the obtaining,
wherein the obtaining divides the pattern removed areas in predetermined area units in order to obtain the degradation degree in signal characteristics of the wiring pattern for each of the predetermined area units of the pattern removed areas, and
wherein each of the predetermined area units has a side that is determined based on a fall or rise time of a signal transmitted through the wiring pattern and a propagation velocity of the signal in the wiring pattern.

7. The method as claimed in claim 6, wherein the obtaining obtains the degradation degree in signal characteristics in the wiring pattern by using, in a plan view manner, area data of the pattern removed area that is located within a predetermined range in a width direction with respect to the wiring pattern.

8. The method as claimed in claim 6, further comprising:
grading, by the computer, the wiring patterns according to the degradation degrees in signal characteristics.

9. The method as claimed in claim 6, wherein the degradation degree in signal characteristics in the wiring pattern includes a degradation degree in signal characteristics caused by a change in characteristic impedance of the wiring pattern or crosstalk occurring in the wiring pattern.

10. A non-transitory computer-readable recording medium having stored therein a program for causing a computer to execute a process to assist a test of wiring patterns that are formed on a printed circuit board, the process comprising:
accessing a first database that stores attribute information and position information that indicate attributes and positions of the wiring patterns in a manner in which the attribute information and the position information are associated with the wiring patterns, a second database that stores position information and size information that indicate positions and sizes of pattern removed areas that exist in solid patterns provided in the printed circuit board, and a third database that stores degradation degree information that indicates degradation degrees in signal characteristics in the wiring patterns with respect to positional relationships between the wiring patterns and the pattern removed areas, and sizes of the pattern removed areas;

obtaining a degradation degree in the signal characteristics in the wiring pattern corresponding to the attribute information that is input to an input unit, based on position information of the wiring pattern corresponding to the attribute information input to the input unit, position information and size information of the pattern removed area, and the degradation degree information; and extracting for an actual measurement test the wiring pattern that has the degradation degree equal to or more than a predetermined degree, from the wiring patterns for which degradation degrees have been obtained by the obtaining, wherein the obtaining divides the pattern removed areas in predetermined area units in order to obtain the degradation degree in signal characteristics of the wiring pattern for each of the predetermined area units of the pattern removed areas, and wherein each of the predetermined area units has a side that is determined based on a fall or rise time of a signal transmitted through the wiring pattern and a propagation velocity of the signal in the wiring pattern.

11. The non-transitory computer-readable recording medium as claimed in claim 10, wherein the obtaining obtains the degradation degree in signal characteristics in the wiring pattern by using, in a plan view manner, area data of the pattern removed area that is located within a predetermined range in a width direction with respect to the wiring pattern.

12. The non-transitory computer-readable recording medium as claimed in claim 10, wherein printed circuit board test assisting process further comprises:

grading the wiring patterns according to the degradation degrees in signal characteristics.

13. The non-transitory computer-readable recording medium as claimed in claim 10, wherein the degradation degree in signal characteristics in the wiring pattern includes a degradation degree in signal characteristics caused by a change in characteristic impedance of the wiring pattern or crosstalk occurring in the wiring pattern.

\* \* \* \* \*